(12) United States Patent
Briano et al.

(10) Patent No.: US 12,265,103 B2
(45) Date of Patent: Apr. 1, 2025

(54) LEADLESS CURRENT SENSOR PACKAGE WITH HIGH ISOLATION

(71) Applicant: Allegro MicroSystems, LLC, Manchester, NH (US)

(72) Inventors: Robert A. Briano, Auburn, NH (US); Michael C. Doogue, Bedford, NH (US); William P. Taylor, Amherst, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 323 days.

(21) Appl. No.: 17/817,796

(22) Filed: Aug. 5, 2022

(65) Prior Publication Data

US 2024/0044946 A1 Feb. 8, 2024

(51) Int. Cl.
*G01R 19/00* (2006.01)
*G01R 15/14* (2006.01)
(Continued)

(52) U.S. Cl.
CPC ....... *G01R 19/0092* (2013.01); *G01R 15/146* (2013.01); *G01R 15/207* (2013.01); *H01L 21/4821* (2013.01); *H01L 23/4951* (2013.01); *H01L 23/49531* (2013.01); *H01L 24/45* (2013.01); *H05K 1/111* (2013.01); *H05K 1/181* (2013.01); *H05K 1/189* (2013.01); *H05K 3/301* (2013.01); *H01L 2224/4502* (2013.01); *H05K 2201/09227* (2013.01);
(Continued)

(58) Field of Classification Search
CPC .. G01R 19/0092; G01R 15/146; G01R 33/02; G01R 33/0047; G01R 15/207; H01L 21/4821; H01L 23/4951; H01L 23/49531; H01L 24/45; H01L 2224/4502; H01L 23/3121; H01L 23/49833; H01L 23/49861; H05K 1/111; H05K 1/181; H05K 1/189; H05K 3/301; H05K 2201/09227; H05K 2201/09445; H05K 2201/10151; H05K 2201/10636; H05K 2201/10977
See application file for complete search history.

(56) References Cited

U.S. PATENT DOCUMENTS

| | | |
|---|---|---|
| 6,356,068 B1 | 3/2002 | Steiner et al. |
| 7,768,083 B2 | 8/2010 | Doogue et al. |
| (Continued) | | |

OTHER PUBLICATIONS

U.S. Appl. No. 17/654,254, filed Mar. 10, 2022, Boden, et al.

*Primary Examiner* — Amy He
(74) *Attorney, Agent, or Firm* — Daly, Crowley, Mofford & Durkee, LLP

(57) ABSTRACT

A sensor package comprising a lead frame, a current sensor die, and an interposer. The lead frame includes: (i) a primary conductor, (ii) a plurality of secondary leads, and (iii) a layer of dielectric material that is disposed between the primary conductor and the plurality of secondary leads. The current sensor die includes one or more sensing elements. The current sensor die is configured to measure a level of electrical current through the primary conductor of the lead frame. The interposer is disposed over the layer of dielectric material. The interposer includes a plurality of conductive traces that are configured to couple each of a plurality of terminals of the current sensor die to a respective one of the plurality of secondary leads.

34 Claims, 14 Drawing Sheets

(51) Int. Cl.
    *G01R 15/20*     (2006.01)
    *H01L 21/48*     (2006.01)
    *H01L 23/00*     (2006.01)
    *H01L 23/495*    (2006.01)
    *H05K 1/11*      (2006.01)
    *H05K 1/18*      (2006.01)
    *H05K 3/30*      (2006.01)

(52) U.S. Cl.
    CPC .............. *H05K 2201/09445* (2013.01); *H05K 2201/10151* (2013.01); *H05K 2201/10636* (2013.01); *H05K 2201/10977* (2013.01)

(56) References Cited

U.S. PATENT DOCUMENTS

| | | | |
|---|---|---|---|
| 8,629,520 B2 | 1/2014 | Doogue et al. | |
| 8,629,539 B2 | 1/2014 | Milano et al. | |
| 8,907,437 B2 | 12/2014 | Milano et al. | |
| 8,952,471 B2 | 2/2015 | Doogue et al. | |
| 9,082,957 B2 | 7/2015 | Doogue et al. | |
| 9,859,489 B2 | 1/2018 | Doogue et al. | |
| 9,941,224 B2 | 4/2018 | Lamar et al. | |
| 10,069,063 B2 | 9/2018 | Doogue et al. | |
| 10,145,904 B2 | 12/2018 | Klebanov et al. | |
| 10,147,689 B2 | 12/2018 | Lamar et al. | |
| 10,345,343 B2 | 7/2019 | Milano et al. | |
| 10,352,969 B2 | 7/2019 | Milano et al. | |
| 10,622,549 B2 | 4/2020 | Chetlur et al. | |
| 10,753,963 B2 | 8/2020 | Milano et al. | |
| 11,262,385 B2 | 3/2022 | Milano et al. | |
| 11,519,946 B1 | 12/2022 | Rock et al. | |
| 2013/0020660 A1* | 1/2013 | Milano | G01R 15/207 257/E27.005 |
| 2014/0253103 A1 | 9/2014 | Racz et al. | |
| 2016/0379954 A1* | 12/2016 | Cahill | H01L 24/48 257/659 |
| 2022/0165647 A1 | 5/2022 | Briano et al. | |

\* cited by examiner

LEADLESS CURRENT SENSOR PACKAGE WITH HIGH ISOLATION

BACKGROUND

As is known, sensors are used to perform various functions in a variety of applications. Some sensors include one or magnetic field sensing elements, such as a Hall effect element or a magnetoresistive element, to sense a magnetic field associated with proximity or motion of a target object, such as a ferromagnetic object in the form of a gear or ring magnet, or to sense a current, as examples. Sensor integrated circuits are widely used in automobile control systems and other safety-critical applications. There are a variety of specifications that set forth requirements related to permissible sensor quality levels, failure rates, and overall functional safety.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

According to aspects of the disclosure, a sensor package is provided comprising: a lead frame including: (i) a primary conductor, (ii) a plurality of secondary leads, and (iii) a layer of dielectric material that is disposed between the primary conductor and the plurality of secondary leads; a current sensor die including one or more sensing elements, the current sensor die being configured to measure a level of electrical current through the primary conductor of the lead frame; and an interposer that is disposed over the layer of dielectric material, the interposer including a plurality of conductive traces that are configured to couple each of a plurality of terminals of the current sensor die to a respective one of the plurality of secondary leads.

According to aspects of the disclosure, a sensor package is provided comprising: a lead frame including: (i) a primary conductor, (ii) a plurality of secondary leads, and (iii) a layer of dielectric material that is disposed between the primary conductor and the plurality of secondary leads; an isolation structure that is disposed over the primary conductor; a current sensor die including one or more sensing elements, the current sensor die being configured to measure a level of electrical current through the primary conductor of the lead frame; an interposer that is disposed over the layer of dielectric material, the interposer including a plurality of conductive traces; a plurality of first wire bonds, each of the first wire bonds being configured to couple the current sensor die to a different one of the plurality of conductive traces; and a plurality of second wire bonds, each of the plurality of second wire bonds being configured to couple a different one of the plurality of conductive traces to a respective one of the plurality of secondary leads.

According to aspects of the disclosure, a method is provided comprising: providing a primary conductor and a plurality of secondary leads; providing a layer of dielectric material between the primary conductor and the plurality of secondary leads; providing an isolation structure over the primary conductor; mounting a current sensor die on the isolation structure; mounting an interposer on the layer of dielectric material, the interposer including a plurality of conductive traces; providing a plurality of first wire bonds, each of the first wire bonds being configured to couple the current sensor die to a different one of the plurality conductive traces; and providing a plurality of second wire bonds, each of the second wire bonds being configured to couple a different one of the plurality of conductive traces to a respective one of the plurality of secondary leads.

According to aspects of the disclosure, a method is provided for manufacturing a sensor package, the method comprising: providing a lead frame including: (i) a primary conductor, (ii) a plurality of secondary leads, and (iii) a layer of dielectric material that is disposed between the primary conductor and the plurality of secondary leads; providing a current sensor die including one or more sensing elements, the current sensor die being configured to measure a level of electrical current through the primary conductor of the lead frame; providing an interposer that is disposed over the layer of dielectric material, the interposer including a plurality of conductive traces that are configured to couple the current sensor die to the plurality of secondary leads.

According to aspects of the disclosure, a sensor package is provided comprising: a lead frame including: (i) a primary conductor, (ii) a plurality of secondary leads, and (iii) a layer of dielectric material that is disposed between the primary conductor and the plurality of secondary leads; a current sensor die including one or more sensing elements, the current sensor die being configured to measure a level of electrical current through the primary conductor of the lead frame; and an interposer that is disposed over the layer of dielectric material, the interposer including a plurality of conductive members that are configured to couple each of a plurality of terminals of the current sensor die to a respective one of the plurality of secondary leads.

BRIEF DESCRIPTION OF THE DRAWING FIGURES

Other aspects, features, and advantages of the claimed invention will become more fully apparent from the following detailed description, the appended claims, and the accompanying drawings in which like reference numerals identify similar or identical elements. Reference numerals that are introduced in the specification in association with a drawing figure may be repeated in one or more subsequent figures without additional description in the specification in order to provide context for other features.

DETAILED DESCRIPTION

Figure 1:
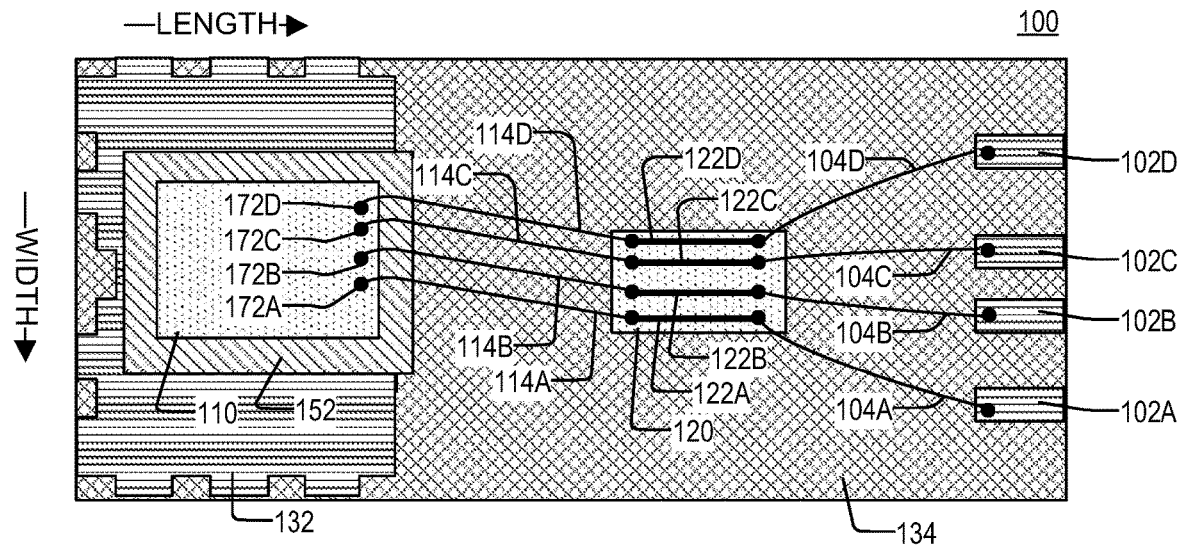
FIG. 1 is a top-down view of a sensor package, according to aspects of the disclosure.
Figure 2:
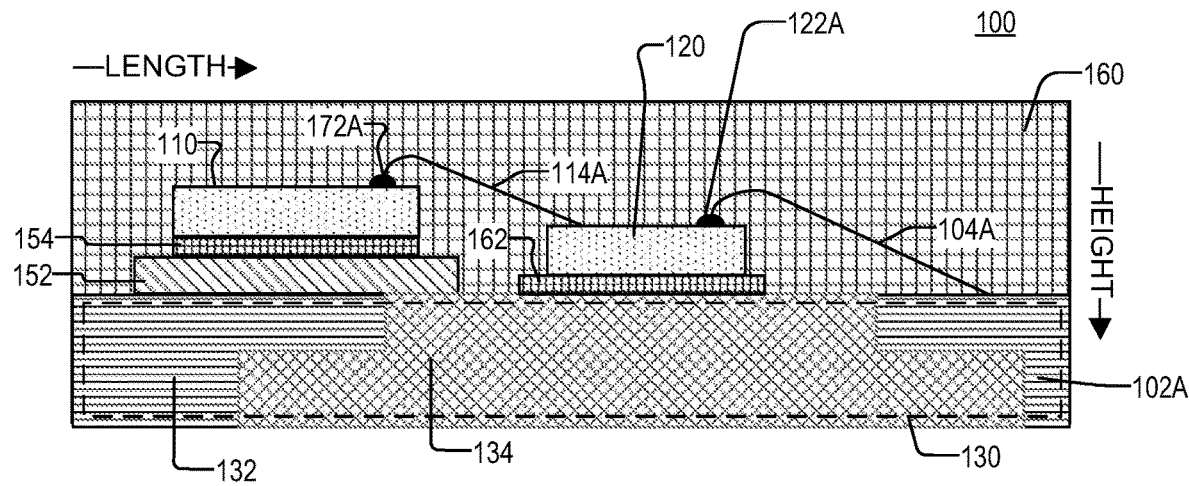
FIG. 2 is cross-sectional side view of the sensor package of FIG. 1, according to aspects of the disclosure.
Figure 3:
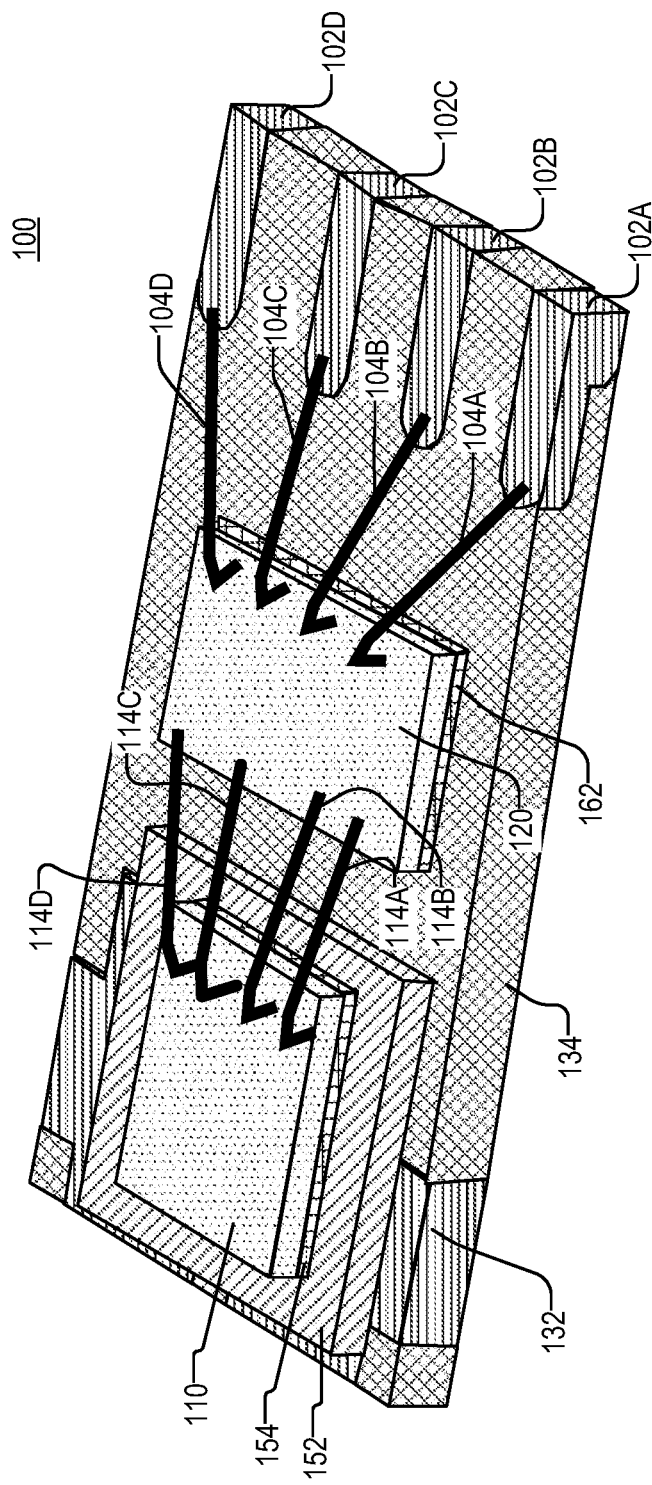
FIG. 3 is a perspective view of the sensor package of FIG. 1, according to aspects of the disclosure.

FIGS. 1-3 show an example of a sensor package 100, according to aspects of the disclosure. The sensor package 100 may include a leadframe 130. The leadframe 130 may include a primary conductor 132 and a plurality of secondary leads 102A-D that are separated from one another by a layer of dielectric material 134. A current sensor die 110 may be placed over the primary conductor 132 and an interposer 120 may be disposed over the layer of dielectric material 134. Each of the secondary leads 102A-D may include a metal member that is arranged to couple the sensor package 100 to external circuitry.

An isolation structure 152 may be disposed between the current sensor die 110 and the primary conductor 132. The isolation structure 152 may be a voltage isolation structure. The isolation structure 152 may be configured to electrically isolate the current sensor die 110 from the primary conductor 132 to prevent the current sensor die 110 from being damaged by high voltage across the primary conductor 132. A die attach layer 154 may be disposed between the isolation structure 152 and the current sensor die 110. The die attach layer 154 may be formed of a die-attach film, dispensed epoxy, and/or any other suitable type of adhesive material. The die-attach layer 154 may be used to affix the current sensor die 110 to the isolation structure 152. The interposer 120 may be affixed to the layer of dielectric material 134 via a die-attach layer 162. The die-attach layer 162 may be formed of a die-attach film, dispensed epoxy, and/or any other suitable type of adhesive material.

The isolation structure 152, according to the present example, is formed of isolation tape, which is comprised of dielectric film and an adhesive layer. However, the present disclosure is not limited to any specific implementation of the isolation structure 152. For instance, the isolation structure 152 may be formed by using FR-4 PC board material, a flexible circuit board, which may be made of polyimide, an alumina substrate or alumina ceramic material, and a wafer that has been coated with insulating material. The insulating material may be a polymer, or an inorganic layer such as a nitride or oxide layer, or multiple layers of different insulating materials. According to the present example, the length of the isolation structure 152 is greater than the length of the sensor die 110 and the width of the isolation structure 152 is greater than the width of the sensor die 110. In the example of FIG. 2, the isolation structure 152 overlaps with the primary conductor 132 and the layer of dielectric material 134, such that a portion of the isolation structure 152 is situated directly above the primary conductor 132 and another portion of the isolation structure 152 is disposed directly above the layer of dielectric material 134. However, in some implementations the entire isolation structure may be disposed over the primary conductor 152. Furthermore, in some implementations, the entire sensor die 110 may be disposed over the primary conductor 152. Disposing the entire sensor die 110 over the primary conductor 152 may be preferred from a mechanical stability point of view.

Figure 5:
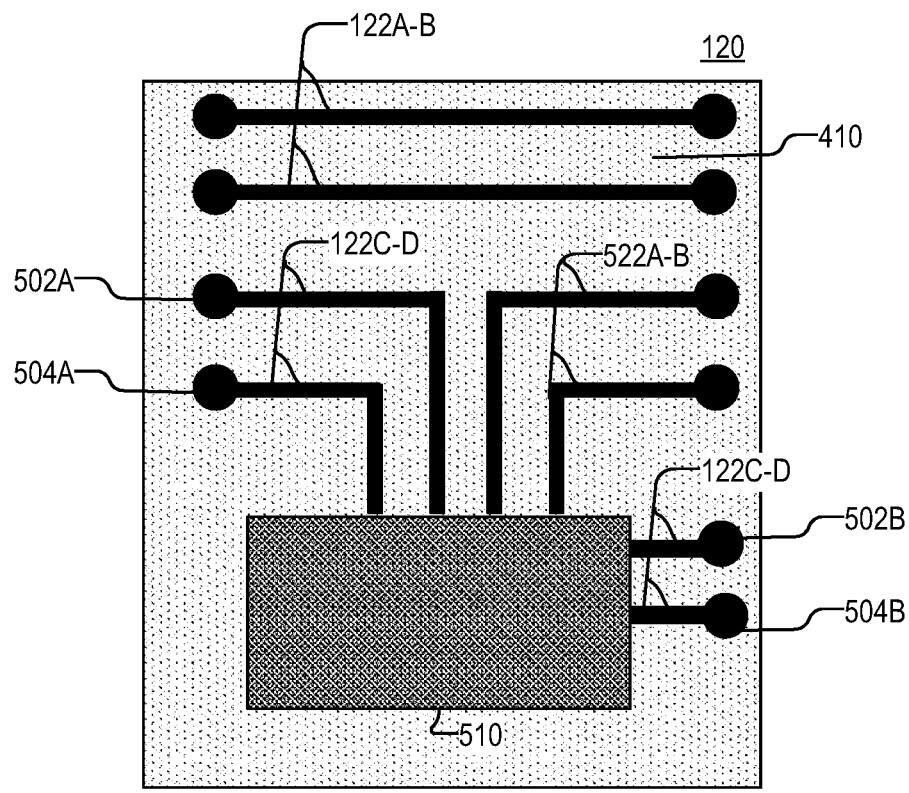
FIG. 5 is a top-down view of an example of an interposer, according to aspects of the disclosure.
Figure 6:
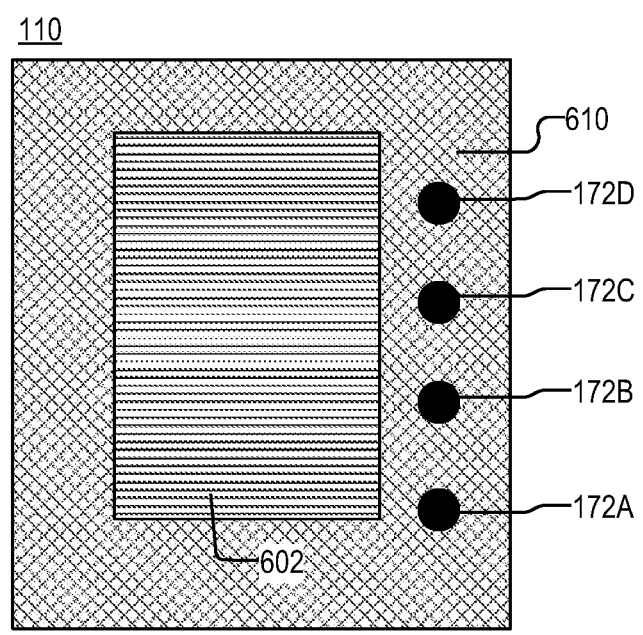
FIG. 6 is a top-down view of a current sensor die, according to aspects of the disclosure.

As illustrated in FIG. 6, the current sensor die 110 may include a substrate 610 one or more magnetic field sensing elements 602, and terminals 172A-D. Any of the magnetic field sensing elements 602 may include one or more of a giant magnetoresistor (GMR), a tunnel magnetoresistor (TMR), a Hall element, a receiving coil, and/or any other suitable type of magnetic field sensing element. The terminals 172A-D may be electrically coupled to the magnetic field sensing elements 602. The terminals 172A-D may be configured to power to magnetic field sensing elements 602 and/or receive signals that are generated by the magnetic field sensing elements 602. In implementations in which the magnetic field sensing elements 602 are GMR or TMR elements, the magnetic field sensing elements 602 may be arranged in a full-bridge circuit (e.g., a Wheatstone bridge circuit). In implementations in which the magnetic field sensing elements are Hall elements, the magnetic field sensing elements may be arranged in a single-ended or differential arrangement. Irrespective of the topology of the circuit in which the magnetic field sensing elements 602 are part of, the terminals 172A-B may be configured to provide power and ground signals to the magnetic field sensing elements 602, and the terminals 172C-D may be configured to output a differential signal (or single-ended signals) that are generated by the magnetic field sensing elements 602. The differential signal may be indicative of the strength of a magnetic field that is generated by the primary conductor 132 as a result of electrical current flowing through the primary conductor 132. The differential signal may be used to determine the level of the electrical current through the primary conductor 132. According to the present example, each of the terminals 172A-D includes a respective contact pad for coupling the sensor die 110 to the interposer 120. However, alternative implementations are possible in which any of the terminals 172A-D is implemented as a different type of conductive element. Stated succinctly the present disclosure is not limited to any specific implementation of the terminals 172A-D. Although not shown, the sensor die 110 may include processing circuitry that is formed thereon and coupled to the magnetic field sensing elements 602. The processing circuitry may be the same or similar to the processing circuitry 510, which is discussed further below with respect to FIG. 5.

Figure 4:
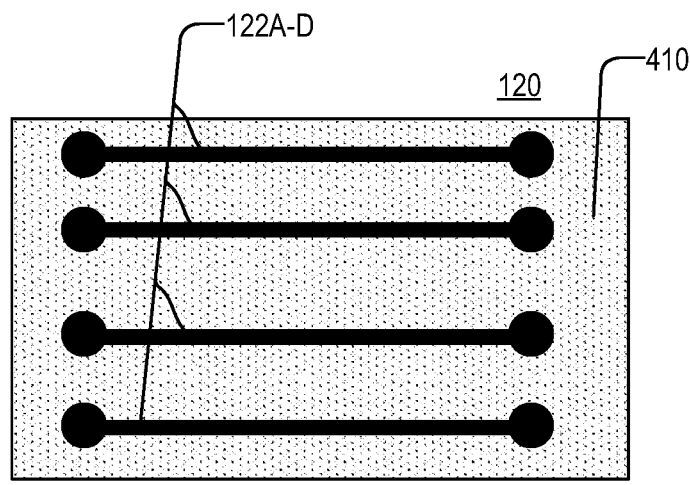
FIG. 4 is a top-down view of an example of an interposer, according to aspects of the disclosure.

As illustrated in FIG. 4, in one implementation, the interposer 120 may include a substrate 410, and a plurality of conductive traces 122A-D that are formed on the substrate 410. In some embodiments, the substrate 410 may be implemented as one of a silicon wafer with insulator (including but not limited to silicon dioxide, silicon nitride, a material such a polyimide, or BCB (benzocyclobutene (tm by Dow)), a glass wafer, a ceramic substrate (e.g., Alumina or low-temperature co-fired ceramic, etc.), a printed circuit board material, such as FR4, or a flexible circuit board. Each of the conductive traces 122A-D may be implemented as a metal layer, such as a copper layer, and/or a layer of any other suitable type of conductive material. Each of the conductive traces 122A-D may be electrically isolated from the substrate 410 and/or the other ones of the conductive traces 122A-D.

Returning to FIGS. 1-3, the interposer 120 may be arranged to couple the current sensor die 110 with the secondary leads 102A-D. Specifically, terminal 172A of the sensor die 110 may be electrically coupled to one end of the conductive trace 122A via a wire bond 114A and the other end of the conductive trace 122A may be coupled to the secondary lead 102A via a wire bond 104A. Terminal 172B of the sensor die 110 may be electrically coupled to one end of the conductive trace 122B via a wire bond 114B and the other end of the conductive trace 122B may be coupled to the secondary lead 102B via a wire bond 104B. Terminal 172C of the sensor die 110 may be electrically coupled to one end of the conductive trace 122C via a wire bond 114C and the other end of the conductive trace 122C may be coupled to the secondary lead 102C via a wire bond 104C. Terminal 172D of the sensor die 110 may be electrically coupled to one end of the conductive trace 122D via a wire bond 114D and the other end of the conductive trace 122D may be coupled to the secondary lead 102D via a wire bond 104D. The sensor die 110, the interposer 120, the wire bonds 114A-D, and the wire bonds 104A-D may be encapsulated in an overmold 160, as shown in FIG. 2.

As noted above, the current sensor die 110 may be configured to measure the current through the primary conductor 132. The primary conductor 132 may be configured to carry a high voltage and/or a large current. For example, in some implementations, the primary conductor 132 may be configured to carry currents in the order of magnitude of 1000 A and the voltage across the primary conductor 132 can reach in excess of 10 kV. The presence of high voltage may necessitate a certain amount of spatial separation (or creepage) between the primary conductor 132 and the secondary leads 102A-D to create a dielectric barrier with high enough breakdown voltage to prevent current to flow from the primary conductor 132 to the secondary leads. A current flow from the primary conductor 132 to the secondary leads 102A-D would make the secondary leads 102A-D roughly the same potential as the primary conductor 132, causing an unsafe potential to be present at the secondary leads 102A-D (which in turn could damage external circuitry that is connected to the secondary leads). According to one example, the spatial separation needs to be at least 0.8 mm. The magnitude of the desired spatial separation makes it impossible to use a single run of wire bond to couple each of the terminals 172-D to a respective one of the secondary leads 102A-D. In general, bonding wires (i.e., wire bonds) of length above 2 mm can begin to droop (although the maximum bonding wire length can be different for different manufacturers and wirebond material). Because drooping can compromise the reliability of wire bond connections, many manufacturers have design rules that prohibit the use of bonding wires that are longer than 2 mm. In this regard, the use of the interposer 120 is advantageous because it enables sufficient spacing between the primary conductor 132 and the secondary leads 102A-D while still permitting the usage of bond wires for the connection of the current sensor die 110 to the secondary leads 102A-D. An advantage of using a configuration with an interposer and bond wires to couple the current sensor die 110 and to the secondary leads 102A-D is that this configuration can be manufactured with standard multi-die packaging techniques, and as such, this configuration can be more cost-effective than configurations that utilize custom packaging techniques (to achieve a desired spatial separation between the primary conductor and secondary leads). The desired separation may be in the range of 4-8 mm for voltages across the primary conductor 132 that are about 10 kV. However, the desired separation is application specific, and the present disclosure is not limited to any specific separation length. Alternative ways for coupling the sensor die 110 to the secondary leads 102A-D via the interposer 120 are discussed further below with respect to FIGS. 8A-10B. The alternative ways for coupling the sensor die 110 to the secondary leads 102A-D, which are discussed with respect to FIGS. 8A-10B, can also be implemented by using multi-die packaging techniques that are in the range of existing packaging capability.

FIG. 5 is a diagram of the interposer 120 in accordance with another implementation. In the example of FIG. 5, the interposer 120 is provided with a processing circuitry 510. The processing circuitry 510 may include any suitable type of processing circuitry. In one example, the processing circuitry 510 may include an analog-to-digital converter (ADC) that is configured to digitize at least one analog signal that is generated by the magnetic field sensing elements 602. Additionally or alternatively, in some implementations, the processing circuitry may include a signal processing circuit that is configured to apply one or more trims on the signal(s) generated by the magnetic field sensing elements 602. By way of example, the processing circuitry 510 may include one or more amplifiers, one or more special or general-purpose processors, one or more memory registers, and/or any other suitable type of processing circuitry 510. In the example of FIG. 5, the processing circuitry is configured to receive an input signal on legs 502A and 504A of conductive traces 122C-D and output an output signal on legs 502B and 504B of conductive traces 122C-D. The input signal may be generated, at least in part, by the magnetic field sensing elements 602. The output signal may be generated, at least in part, based on the input signal. As noted above, the output signal may be a digitized version of the input signal and/or a trimmed version of the input signal. As used herein, the phrase "trimmed version of an input signal" may refer to an analog or digital version of the input signal that is adjusted for various factors, such as temperature, humidity, mechanical stress, noise, etc. The version of the signal that is output on legs 502B and 504B of the conductive traces 122C-D may be provided to external circuitry that is electrically coupled to the sensor package 100. Furthermore, the interposer 120 may be provided with additional conductive traces 522A-B. The additional conductive traces 522A-B may be coupled to additional secondary leads (not shown) that are present in the sensor package 100. The conductive traces 522A-B may be configured to provide the processing circuitry 510 with a clock signal, a data signal, and/or any other suitable type of input signal. In some respects, the conductive traces 522A-B may be used by external electronic circuitry to interact with the processing circuitry 510. Although in the example of FIG. 5, the circuitry 510 is implemented as a processing circuitry, alternative implementations are possible in which the circuitry 510 includes another type of circuitry, in addition to or instead of processing circuitry. For example, the circuitry 510 may include power circuitry for controlling one or more characteristics of the current or voltage that are supplied to the sensing elements 602. One example of power circuitry includes a voltage regulator for controlling the voltage that is supplied to the sensing elements 602, etc.

Figure 7:
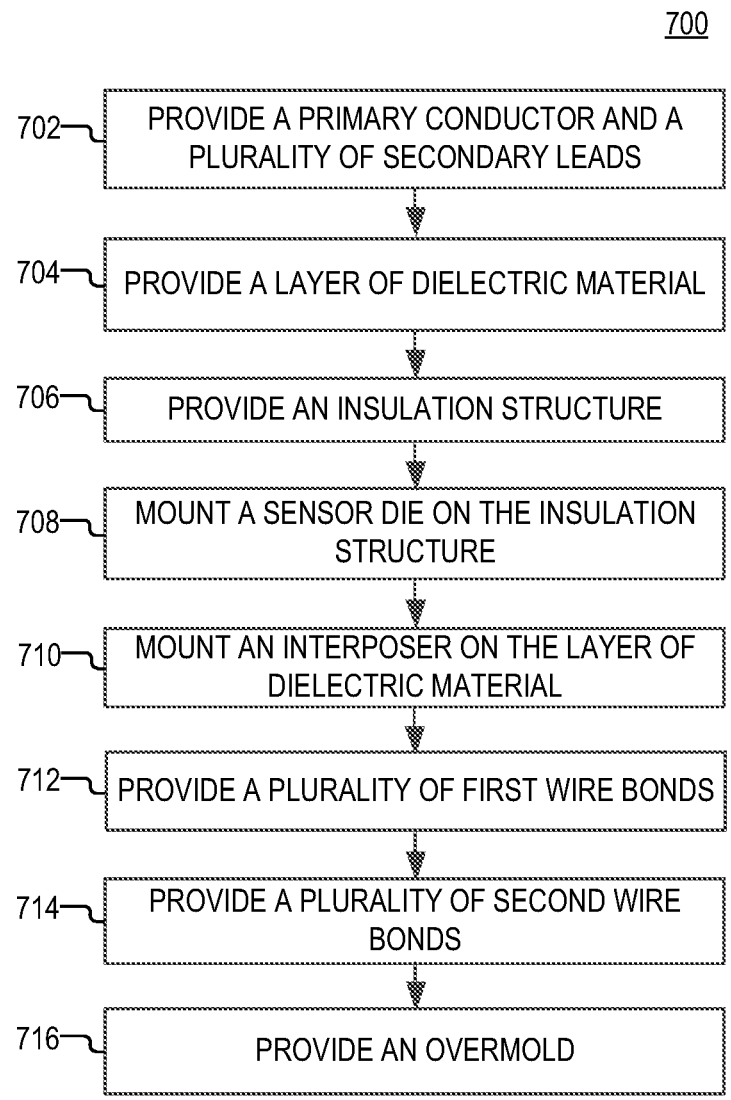
FIG. 7 is a flowchart of an example of a process for manufacturing the sensor package of FIG. 1, according to aspects of the disclosure.

FIG. 7 is a flowchart of an example of a process 700 for manufacturing the sensor package 100, according to aspects of the disclosure.

At step 702, a primary conductor and a plurality of secondary leads are provided. The primary conductor may be the same or similar to the primary conductor 132, which is discussed above with respect to FIGS. 1-3. The secondary leads may be the same or similar to the secondary leads 102A-D, which are also discussed above with respect to FIGS. 1-3.

At step 704, a layer of dielectric material is provided between the primary conductor and secondary leads. In some implementations, the layer of dielectric material may be injection molded over the primary conductor and the secondary leads to form a leadframe. Additionally or alternatively, in some implementations, the layer of dielectric material may be provided by heating and melting dielectric powder to form a leadframe. The layer of dielectric material may be the same or similar to the layer 134 and the leadframe may be the same or similar to the leadframe 130, both of which are discussed above with respect to FIGS. 1-3.

At step 706, an isolation structure is provided over the primary conductor. The isolation structure may be the same or similar to the isolation structure 152, which is discussed above with respect to FIGS. 1-3. In one example, the isolation structure may include isolation tape, such as Dupont Kapton™ film with an adhesive layer. However, alternative implementations are possible in which, instead of isolation tape another tape, another type of isolation structure is used, such as a structure formed of ceramic, glass, sapphire or other suitable solid or flexible materials.

At step 708, a sensor die is mounted on the isolation structure. The sensor die may be mounted via a die-attach layer, such as the die-attached layer 154 (shown in FIGS. 1-3). The sensor die may be the same or similar to the sensor die 110, which is discussed above with respect to FIGS. 1-3.

At step 710, an interposer is mounted over the layer of dielectric material (provided at step 704). In some implementations, the interposer may be mounted by using a die-attach layer, such as the layer 162 (shown in FIGS. 1-3). The interposer may be the same or similar to the interposer 120, which is discussed above with respect to FIGS. 1-3.

At step 712, a plurality of first wire bonds is provided. Each of the first wire bonds may have a first end that is coupled to a respective terminal on the sensor die (provided at step 708) and a second end that is coupled to a respective conductive trace on the interposer (provided at step 710). The first wire bonds may be the same or similar to the wire bonds 114A-D, which are discussed above with respect to FIGS. 1-3.

At step 714, a plurality of second wire bonds is provided. Each of the second wire bonds may have a first end that is coupled to a respective conductive trance on the interposer (provided at step 710) and a respective one of the secondary leads (provided at step 702). The second wire bonds may be the same or similar to the wire bonds 104A-D, which are discussed above with respect to FIGS. 1-3.

At step 716, an overmold is provided over the sensor die (provided at step 708) and the interposer (provided at step 710). The overmold may be formed of Sumitomo E670 or G700™ mold compounds. The overmold may be the same or similar to the overmold 160, which is discussed above with respect to FIG. 2.

Figure 8A:
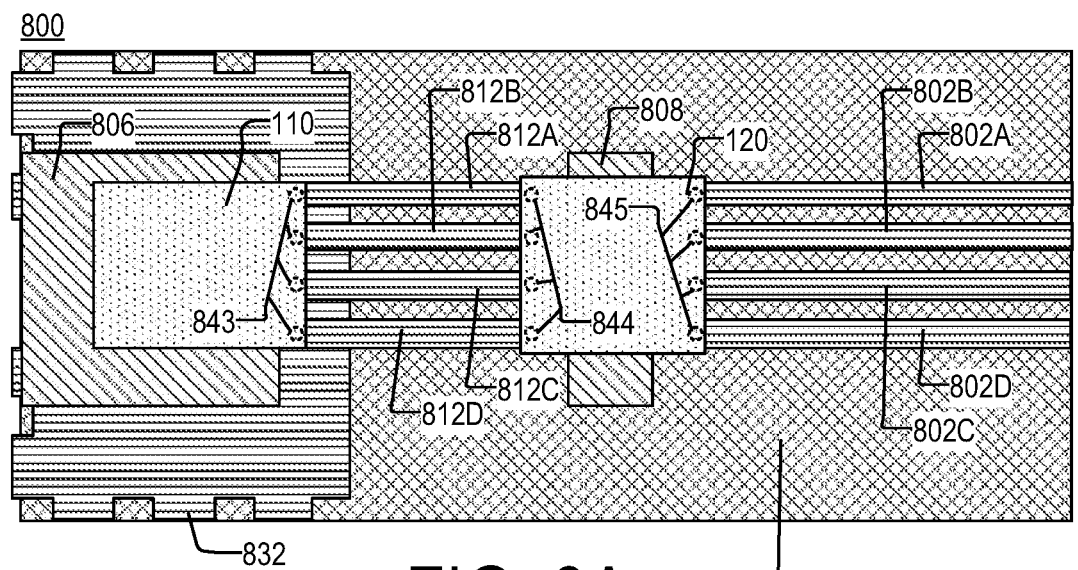
FIG. 8A is a top-down view of an example of a sensor package, according to aspects of the disclosure.
Figure 8B:
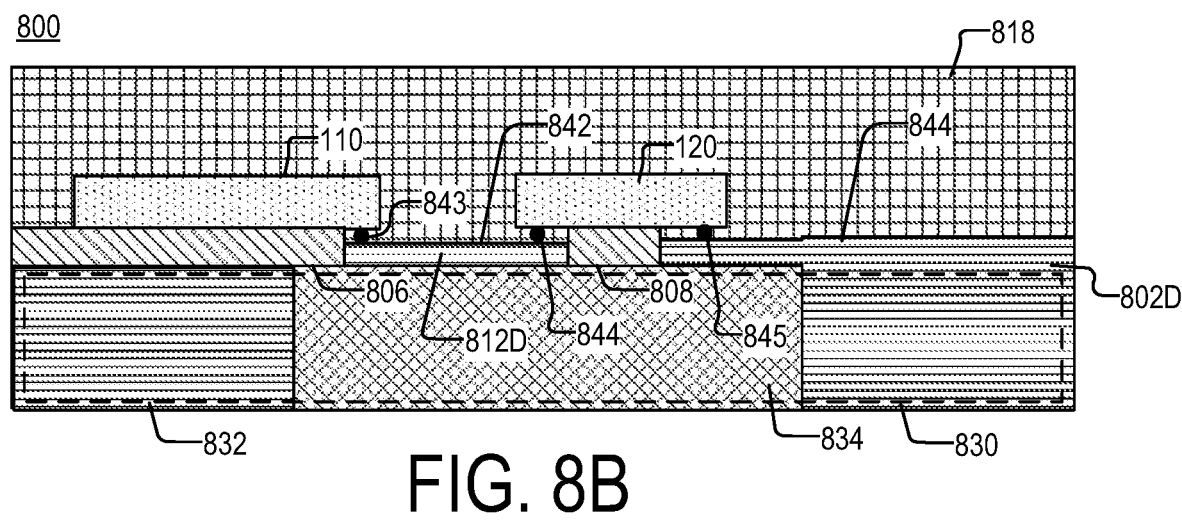
FIG. 8B is a cross-sectional side view of the sensor package of FIG. 8A, according to aspects of the disclosure.

FIGS. 8A-B show an example of a sensor package 800, according to aspects of the disclosure. Similar to the sensor package 100 (shown in FIGS. 1-3), the sensor package 800 may also include the sensor die 110 (shown in FIG. 6) and the interposer 120 (shown in FIGS. 4-5). In the example of FIGS. 8A-B, the interposer 120 and the sensor die 110 are arranged in a flip-chip configuration, which enables the interposer 120 to be coupled directly to secondary leads 802A-D, and which also enables the sensor die 110 and the interposer 120 to be electrically coupled via internal conductors 812A-D. Each of the secondary leads 802A-D may be the same or similar to any of the secondary leads 102A-D, which are discussed above with respect to FIGS. 1-3.

As illustrated, the sensor package 800 may include a primary conductor 832 and a plurality of secondary leads 802A-D. A layer of dielectric material 834 may be formed between the primary conductor 832 and the secondary leads 802A-D to form a leadframe 830. The primary conductor 832 may be the same or similar to the primary conductor 132, which is discussed above with respect to FIGS. 1-3. The primary conductor 832 may be configured to carry an electrical current that is measured by the sensor die 110.

The sensor die 110 may be disposed over the primary conductor 832. The sensor die 110 may include terminals 172A-D, which are shown in FIG. 6. Terminal 172A of the sensor die 110 may be coupled to the internal conductor 812A via a respective conductive structure 843; terminal 172B of the sensor die 110 may be coupled to the internal conductor 812B via a respective conductive structure 843; terminal 172C of the sensor die 110 may be coupled to the internal conductor 812C via a respective conductive structure 843; and terminal 172D of the sensor die 110 may be coupled to the internal conductor 812D via a respective conductive structure 843. Each of the conductive structures 843 may include one or more of a solder ballcopper pillars, a gold bump, a eutectic or high lead solder bump, a no-lead solder bump, a gold stud bump, a polymeric conductive bump, a layer of anisotropic conductive paste, or a conductive film. In some implementations, each of the internal conductors 812A-D may be a metal member that is embedded in the layer of dielectric material 834. Additionally or alternatively, in some implementations, each of the internal conductors 812A-D may be a metal layer that is formed on or applied to the surface of the layer of dielectric material 834. Each of the internal conductors 812A-D may be electrically isolated from the rest of the internal conductors 812A-D.

The sensor die 110 may be coupled to the leadframe 830 (or primary conductor 832) via a mounting structure 806. The mounting structure 806 may include an isolation structure, such as the isolation structure 152 (shown in FIGS. 1-3), and a die-attach layer, such as the die-attach layer 154 (also shown in FIGS. 1-3). The isolation structure may be disposed between the sensor die 110 and the primary conductor 832. The die-attach layer may be disposed between the isolation structure and the sensor die 110. The die-attach layer may be used to affix the sensor die to the isolation structure. The isolation structure may be configured to provide electrical isolation of the sensor die 110 from the primary conductor 832.

The interposer 120 may be coupled to the leadframe 830 via a mounting structure 808. The mounting structure 808 may be disposed between the interposer 120 and the layer of dielectric material 834. The mounting structure 808 may include a die-attach layer, such as the layer 162, which is discussed above with respect to FIGS. 1-3.

The interposer 120 may be arranged to couple the sensor die 110 to the secondary leads 802A-D. The interposer 120 may include conductive traces 122A-D, which are shown in FIGS. 4-5. Conductive trace 122A of the interposer 120 may have a first end that is coupled to the internal conductor 812A via a respective conductive structure 844 and a second end that is coupled to the secondary lead 802A via a respective conductive structure 845. Conductive trace 122B of the interposer 120 may have a first end that is coupled to the internal conductor 812B via a respective conductive structure 844 and a second end that is coupled to the secondary lead 802B via a respective conductive structure 845. Conductive trace 122C of the interposer 120 may have a first end that is coupled to the internal conductor 812C via a respective conductive structure 844 and a second end that is coupled to the secondary lead 802C via a respective conductive structure 845. And conductive trace 122D of the interposer 120 may have a first end that is coupled to the internal conductor 812D via a respective conductive structure 844 and a second end that is coupled to the secondary lead 802D via a respective conductive structure 845. Each of the conductive structures 844 and 845 may include one or more of a solder ball, copper pilar, a gold bump, a eutectic or high lead solder bump, a no-lead solder bump, a gold stud bump, a polymeric conductive bump, a layer of anisotropic conductive paste, or a conductive film. The interposer 120 and sensor die 110 may be encapsulated in an overmold 818, as shown in FIG. 8B.

Figure 9A:
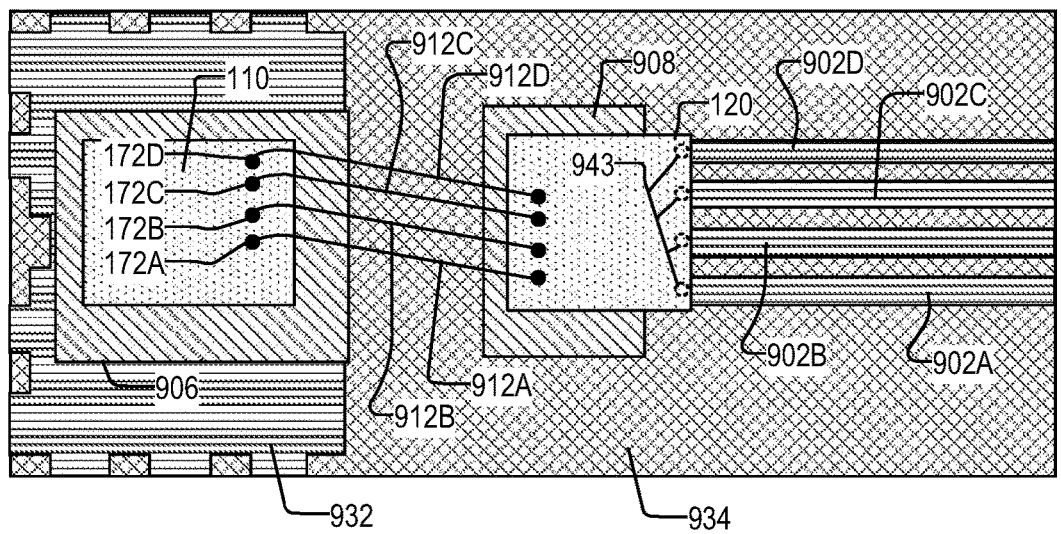
FIG. 9A is a top-down view of an example of a sensor package, according to aspects of the disclosure.
Figure 9B:
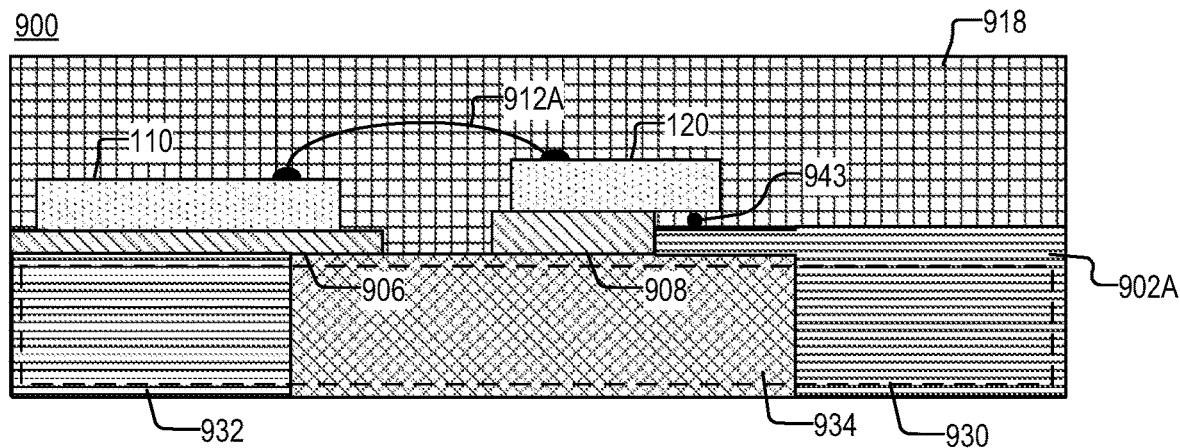
FIG. 9B is a cross-sectional side view of the sensor package of FIG. 9A, according to aspects of the disclosure.

FIGS. 9A-B show an example of a sensor package 900, according to aspects of the disclosure. Similar to the sensor package 100 (shown in FIGS. 1-3), the sensor package 900 may also include the sensor die 110 (shown in FIG. 6) and an interposer 120. In the example of FIGS. 9A-B, the interposer 120 is arranged in a semi-flip-chip configuration in which opposite ends of the conductive traces 122A-D of the interposer 120 are exposed on opposite surfaces of the interposer 120. This enables the use of wire bonds 912A-D to couple the interposer 120 to the sensor die 110, while conductive structures 943 are used to couple the interposer 120 to secondary leads 902A-D. Each of the conductive structures 943 may be the same or similar to any of the conductive structures 843, 844, and 845, which are discussed above with respect to FIGS. 8A-B. Each of the secondary leads 902A-D may be the same or similar to any of the secondary leads 102A-D, which are discussed above with respect to FIGS. 1-3.

As illustrated, the sensor package 900 may include a primary conductor 932 and a plurality of secondary leads 902A-D. A layer of dielectric material 934 may be formed between the primary conductor 932 and the secondary leads 902A-D to form a leadframe 930. The primary conductor 932 may be the same or similar to the primary conductor 132, which is discussed above with respect to FIGS. 1-3. The primary conductor 932 may be configured to carry an electrical current that is measured by the sensor die 110.

The sensor die 110 may be coupled to the leadframe 930 (or primary conductor 932) via a mounting structure 906. The mounting structure 906 may include an isolation structure, such as the isolation structure 152 (shown in FIGS. 1-3), and a die-attach layer, such as the die-attach layer 154 (also shown in FIGS. 1-3). The isolation structure may be disposed between the sensor die 110 and the primary conductor 932. The die-attach layer may be disposed between the isolation structure and the sensor die 110. The die-attach layer may be used to affix the sensor die to the isolation structure. The isolation structure may be configured to provide electrical isolation of the sensor die 110 from the primary conductor 932.

The interposer 120 may be coupled to the leadframe 930 via a mounting structure 908. The mounting structure 908 may be disposed between the interposer 120 and the layer of dielectric material 934. The mounting structure 908 may include a die-attach layer, such as the layer 162, which is discussed above with respect to FIGS. 1-3.

Figure 9C:
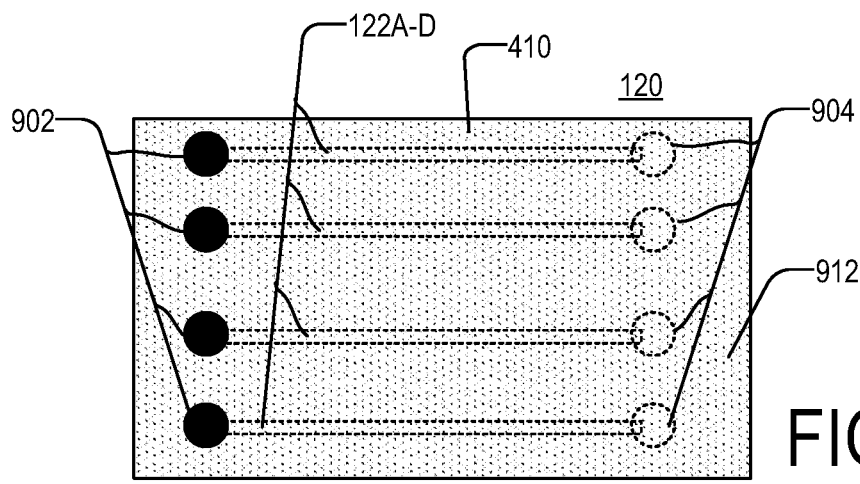
FIG. 9C is a top-down view of an example of an interposer, according to aspects of the disclosure.
Figure 9D:
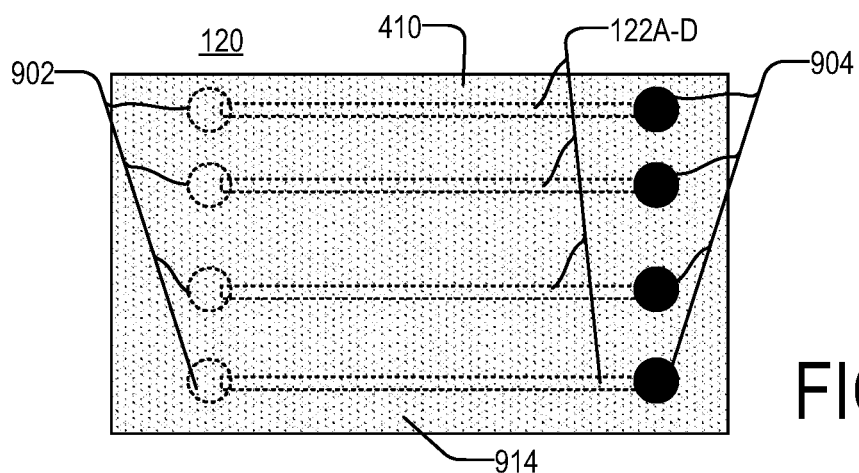
FIG. 9D is a bottom-up view of an example of the interposer of FIG. 9C, according to aspects of the disclosure.
Figure 9E:
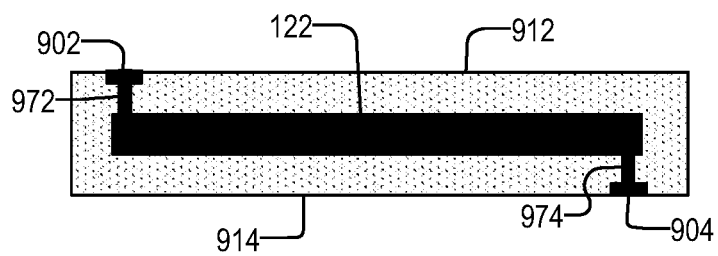
FIG. 9E is a cross-sectional side view of an example of the interposer of FIG. 9C, according to aspects of the disclosure.

The interposer 120 may be arranged to couple the sensor die 110 to the secondary leads 902A-D. The interposer 120 may include conductive traces 122A-D and contact pads 902-904, all of which are shown in FIGS. 9C-E. Conductive trace 122A of the interposer 120 may have a first end that is coupled to terminal 172A of the sensor die 110 via the wire bond 912A and a respective contact pad 902. Conductive trace 122A of the interposer 122 may have a second end that is coupled to the secondary lead 902A via a respective conductive structure 943 and a respective contact pad 904. Conductive trace 122B of the interposer 120 may have a first end that is coupled to terminal 172B of the sensor die 110 via the wire bond 912B and a respective contact pad 902. Conductive trace 122B of the interposer 122 may have a second end that is coupled to the secondary lead 902B via a respective conductive structure 943 and a respective contact pad 904. Conductive trace 122C of the interposer 120 may have a first end that is coupled to terminal 172C of the sensor die 110 via the wire bond 912C and a respective contact pad 902. Conductive trace 122C of the interposer 122 may have a second end that is coupled to the secondary lead 902C via a respective conductive structure 943 and a respective contact pad 904. Conductive trace 122D of the interposer 120 may have a first end that is coupled to terminal 172D of the sensor die 110 via the wire bond 912D and a respective contact pad 902. Conductive trace 122D of the interposer 122 may have a second end that is coupled to the secondary lead 902D via a respective conductive structure 943 and a respective contact pad 904. The interposer 120 and sensor die 110 may be encapsulated in an overmold 918, as shown in FIG. 9B.

FIG. 9C-E show an implementation of the interposer 120 in which opposite ends of the conductive traces 122A-D of the interposer 120 are exposed on opposite surfaces of the interposer 120. As illustrated, in FIG. 9C-E, the conductive traces 122A-D of the interposer 120 may be formed inside the substrate 410. Each of the conductive traces 122A-D may have a respective first end and a respective second end. The respective first end of each of the conductive traces 122A-D may be coupled to a different respective contact pad 902. Each contact pad 902 may be formed on a first surface 912 of the substrate 410. Each contact pad 902 may be electrically coupled to one of the conductive traces 122A-D by using a respective conductive via 972. The respective second end of each of the conductive traces 122A-D may be coupled to a different respective contact pad 904. Each contact pad 904 may be formed on a second surface 914 of the substrate 410. Each contact pad 904 may be electrically coupled to one of the conductive traces 122A-D via a respective conductive via 974.

Although in the example of FIGS. 9C-E each of the conductive traces is formed inside the substrate 410, alternative implementations are possible in which any of the conductive traces 122A-D is formed on one of the surfaces 912 and 914 of the substrate 410. In such implementations, each of the conductive traces 122A-D may be exposed on the other one of the surfaces 912 and 914 via a respective conductive via that is electrically coupled to a contact pad that is formed on that surface. As use throughout the disclosure, the term "contact pad of an interposer" may refer to at least one of: (i) a special structure that is used for connecting a conductive trace of the interposer to a current sensor die or a secondary lead or (ii) a portion of the conductive trace that is connected to the current sensor die or a secondary lead. As discussed above with respect to FIG. 5, the implementation of the interposer 120 that is shown in FIGS. 9C-E may also include processing circuitry, such as the processing circuitry 510. The conductive traces 122A-B may be electrically isolated from one another.

Figure 10A:
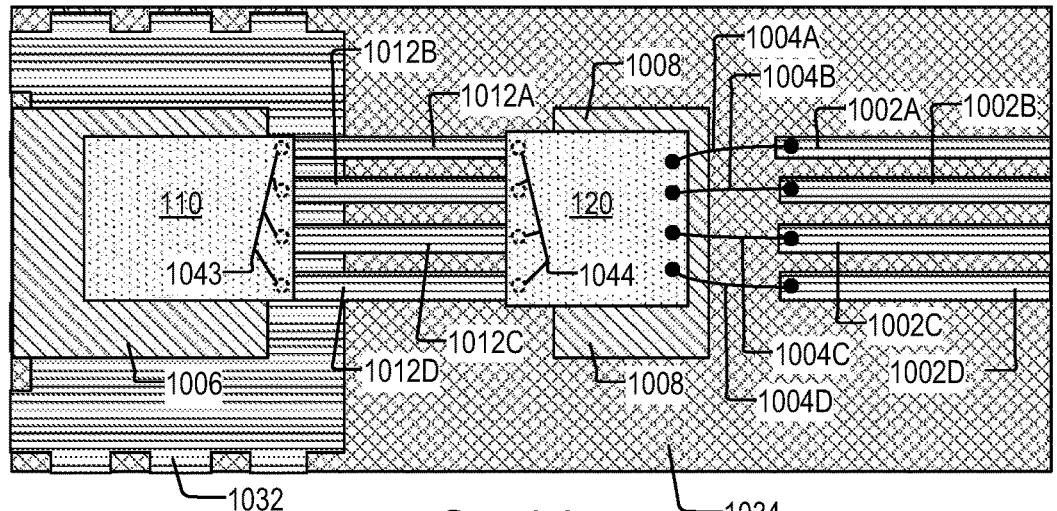
FIG. 10A is a top-down view of an example of a sensor package, according to aspects of the disclosure.
Figure 10B:
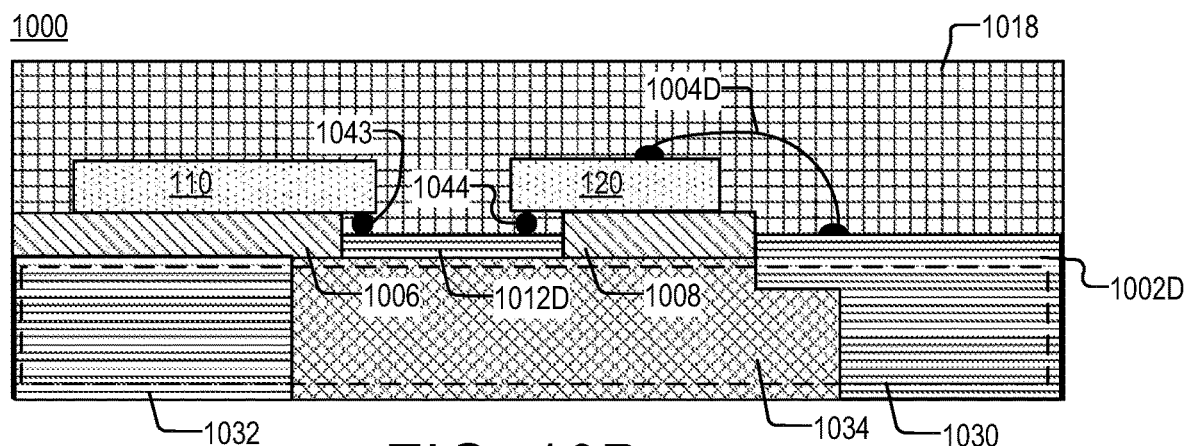
FIG. 10B is a cross-sectional side view of the sensor package of FIG. 10A, according to aspects of the disclosure.

FIGS. 10A-B show an example of a sensor package 1000, according to aspects of the disclosure. Similar to the sensor package 100 (shown in FIGS. 1-3), the sensor package 1000 may also include the sensor die 110 (shown in FIG. 6) and an interposer 120. In the example of FIGS. 10A-B, the interposer 120 is arranged in a semi-flip-chip configuration in which opposite ends of the conductive traces 122A-D of the interposer 120 are exposed on opposite surfaces of the interposer 120. This enables the use of wire bonds 1004A-D to couple the interposer 120 to secondary leads 1002A-D, while internal conductors 1012A-D are used to couple the sensor die 110 with the interposer 120. The interposer 120 may be configured in the same or similar manner as discussed above with respect to FIGS. 9C-E. Each of the internal conductors 1012A-D may be the same or similar to any of the internal conductors 812A-D, which are discussed above with respect to FIGS. 8A-B. Each of the secondary leads 1002A-D may be the same or similar to any of the secondary leads 102A-D, which are discussed above with respect to FIGS. 1-3.

As illustrated, the sensor package 1000 may include a primary conductor 1032 and a plurality of secondary leads 1002A-D. A layer of dielectric material 1034 may be formed between the primary conductor 1032 and the secondary leads 1002A-D to form a leadframe 1030. The leadframe 1030 may be the same or similar to the leadframe 130, which is discussed above with respect to FIGS. 1-3. The primary conductor 1032 may be the same or similar to the primary conductor 132, which is discussed above with respect to FIGS. 1-3. The primary conductor 1032 may be configured to carry an electrical current that is measured by the sensor die 110.

The sensor die 110 may be coupled to the leadframe 1030 via a mounting structure 1006. The mounting structure 1006 may include an isolation structure, such as the isolation structure 152 (shown in FIGS. 1-3), and a die-attach layer, such as the die-attach layer 154 (also shown in FIGS. 1-3). The isolation structure may be disposed between the sensor die 110 and the primary conductor 1032. The die-attach layer may be disposed between the isolation structure and the sensor die 110. The die-attach layer may be used to affix the sensor die to the isolation structure. The isolation structure may be configured to provide electrical isolation of the sensor die 110 from the primary conductor 1032.

The interposer 120 may be coupled to the leadframe 1030 via a mounting structure 1008. The mounting structure 1008 may be disposed between the interposer 120 and the layer of dielectric material 1034. The mounting structure 1008 may include a die-attach layer, such as the layer 162, which is discussed above with respect to FIGS. 1-3.

The interposer 120 may be arranged to couple the sensor die 110 to the secondary leads 1002A-D. The interposer 120 may include conductive traces 122A-D and contact pads 902-904, all of which are shown in FIGS. 9C-E. Conductive trace 122A of the interposer 120 may have a first end that is coupled to the internal conductor 1012A via a respective conductive structure 1044 and a respective contact pad 902. Conductive trace 122A of the interposer 122 may have a second end that is coupled to the secondary lead 1002A via the wire bond 1004A and a respective contact pad 904. Conductive trace 122B of the interposer 120 may have a first end that is coupled to the internal conductor 1012B via a respective conductive structure 1044 and a respective contact pad 902. Conductive trace 122B of the interposer 122 may have a second end that is coupled to the secondary lead 1002B via the wire bond 1004B and a respective contact pad 904 Conductive trace 122C of the interposer 120 may have a first end that is coupled to the internal conductor 1012C via a respective conductive structure 1044 and a respective contact pad 902. Conductive trace 122C of the interposer 122 may have a second end that is coupled to the secondary lead 1002C via the wire bond 1004C and a respective contact pad 904. Conductive trace 122D of the interposer 120 may have a first end that is coupled to the internal conductor 1012D via a respective conductive structure 1044 and a respective contact pad 902. Conductive trace 122D of the interposer 122 may have a second end that is coupled to the secondary lead 1002D via the wire bond 1004D and a respective contact pad 904.

The sensor die 110 may include terminals 172A-D, which are shown in FIG. 6. Terminal 172A of the sensor die 110 may be coupled with internal conductor 1012A via a respective conductive structure 1043. Terminal 172B of the sensor die 110 may be coupled with internal conductor 1012B via a respective conductive structure 1043. Terminal 172C of the sensor die 110 may be coupled with internal conductor 1012C via a respective conductive structure 1043. Terminal 172D of the sensor die 110 may be coupled with internal conductor 1012D via a respective conductive structure 1043. Each of the conductive structures 1043 and 1044 may be the same or similar to any of the conductive structures 843 and 844, which are discussed above with respect to FIGS. 8A-B. The interposer 120 and sensor die 110 may be encapsulated in an overmold 1018, as shown in FIG. 10B.

Figure 10C:
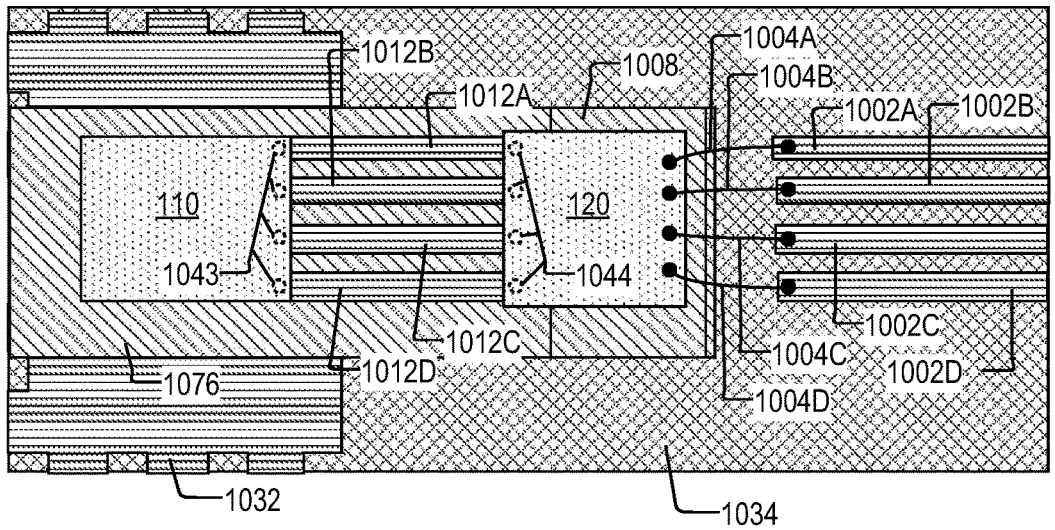
FIG. 10C is a top-down view of an example of a sensor package, according to aspects of the disclosure.
Figure 10D:
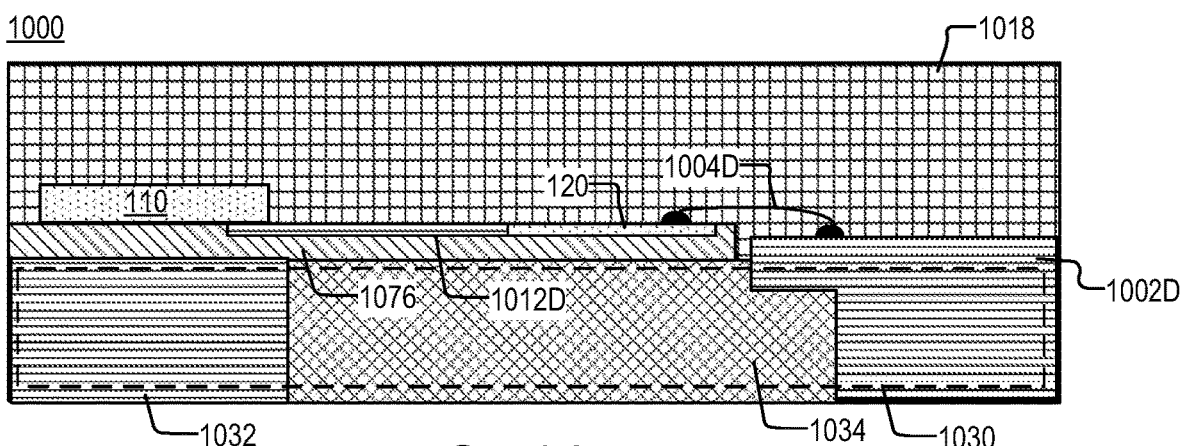
FIG. 10D is a cross-sectional side view of the sensor package of FIG. 10C, according to aspects of the disclosure.

FIGS. 10C-D show an example of the sensor package 1000 in accordance with another implementation. In the implementation of FIGS. 10C-D, the insulating structure 1008 is omitted, and the insulating structure 1006 is replaced with a flexible printed circuit board (PCB) 1076. The internal conductors 1012A-D and the interposer 120 may be formed on the flexible PCB 1076, as shown. The flexible PCB 1076 may be disposed over the leadframe 1030. The sensor die 110 may be disposed on the flexible PCB 1076. The sensor die 110 may be attached to the flexible PCB 1076 via a layer of adhesive material (not shown). Each of the terminals 172A-D of the sensor die 110 may be electrically coupled to a different one of the internal conductors 1012A-D, as discussed above with respect to FIGS. 10A-B. The coupling may be achieved by using conductive structures (such as the conductive structures 1043) or by using wire bonds (such as the wire bonds 114A-D). Each of the internal conductors 1012A-D may be coupled to a different conductive trace 122A-D of the interposer 120. Additionally or alternatively, in some implementations, each of the internal conductors 112A-D may be integral with a different one of the conductive traces 112A-D. Additionally or alternatively, in some implementations, each of the internal conductors 1012A-D and the conductive traces 122A-D may be coupled to additional circuitry that is part of the interposer 120, such as the circuitry 510 (shown in FIG. 5).

In one example, the substrate of the flexible PCB 1076 may be formed of polyimide (PI). Because PI is an insulating material, the PI which forms the substrate of the flexible PCB may serve the dual purpose of providing an insulating structure for electrically isolating the sensor die 110 from the internal conductor 1032 and providing a substrate for the formation of the internal conductors 1012A-D and the interposer 120. In some respects, the flexible PCB 1076, together with the internal conductors 1012A-D and the interposer 120 may be premanufactured and installed as a single unit in the sensor package 1000, thus increasing the efficiency of manufacturing of the sensor package 1000.

In one aspect, FIGS. 10C-D are provided to illustrate that the insulating structure that separates the sensor die 110 from the internal conductor 1032 may be implemented as a flexible PCB having the interposer 120 formed thereon. Although in the example of FIGS. 10C-D, the flexible PCB includes internal conductors which are used to connect the terminals 172A-D of the sensor die 110 to the conductive traces 122A-D of the interposer 120, alternative implementations are possible in which the internal conductors are omitted. In such implementations, the terminals 172A-D of the sensor die 110 may be coupled to the conductive traces 122A-D via wire bonds. Stated succinctly, the example of FIGS. 10C-D is not limited to any specific method for connecting the sensor die 110 to the interposer 120 or any specific method for connecting the interposer 120 to the secondary leads 1002A-D.

Figure 10E:
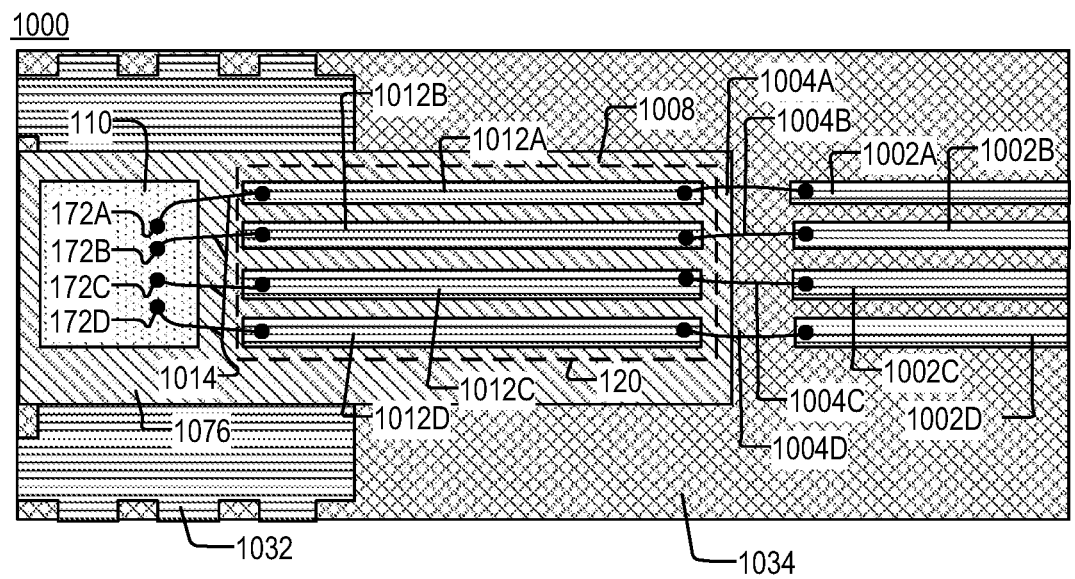
FIG. 10E is a top-down view of an example of a sensor package, according to aspects of the disclosure.
Figure 10F:
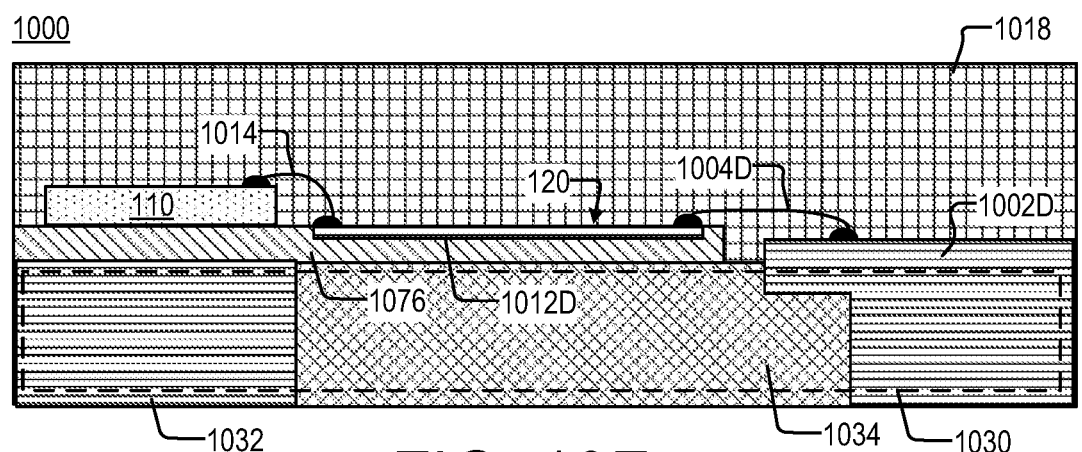
FIG. 10F is a cross-sectional side view of the sensor package of FIG. 10C, according to aspects of the disclosure.

FIGS. 10E-F illustrate another implementation of the sensor package 1000. In the example of FIGS. 10E-F, the interposer 120 is implemented by using the flexible PCB 1076. Furthermore, in the example of FIGS. 10E-F, the interposer 120 includes the internal conductors 1012A-D. Each of the internal conductors 1012A-D is part of the flexible PCB 1076, and each of the internal conductors 1012A-D is implemented as a respective conductive trace on the substrate of the flexible PCB 1076. As illustrated, each of the internal conductors 1012A-D may be coupled to a different one of the terminals 172A-D of the sensor die 110 via a respective wire bond 1014. Furthermore, each of the internal conductors 1012A-D may be coupled to a different one the secondary leads 1002A-D via a respective one of the wire bonds 1004A-D.

Figure 11:
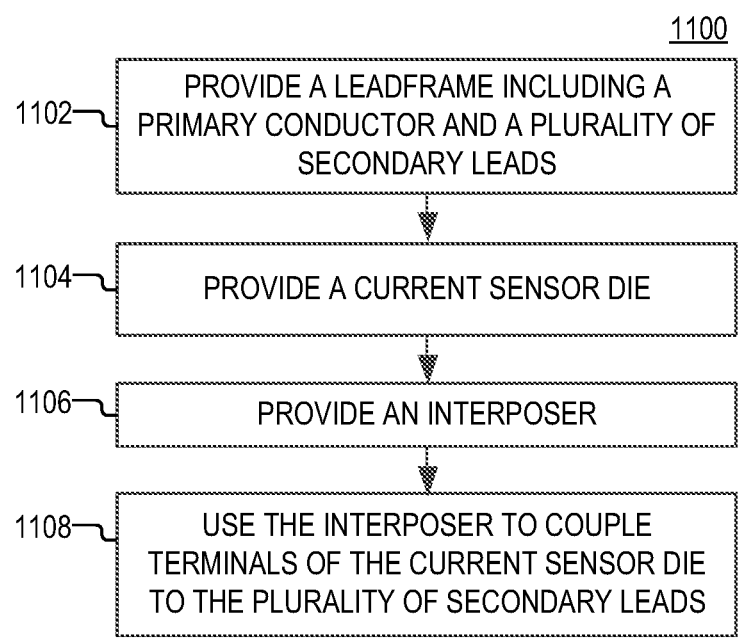
FIG. 11 is a flowchart of an example of a process, according to aspects of the disclosure.

FIG. 11 is a flowchart of an example of a process 1100 for manufacturing a sensor package, according to aspects of the disclosure. At step 1102, a leadframe is provided. The leadframe may be the same or similar to any of the lead frames discussed above with respect to FIGS. 1-10B. The lead frame may include a primary conductor and a plurality of secondary leads that are disposed on opposite sides of a layer of dielectric material. At step 1104, a current sensor die is provided. The current sensor die may be the same or similar to the current sensor die 110. The current sensor die may include a plurality of terminals, such as the terminals 172A-D which are discussed above with respect to FIG. 6. Providing the current sensor die may include mounting the current sensor die on the lead frame. The current sensor die may be mounted in the manner discussed above with respect to FIGS. 1-10B. Specifically, the current sensor die may be mounted over the primary conductor of the lead frame by using an insulating structure that is disposed over the primary conductor and a die-attach layer that is disposed between the insulating structure and the die-attach layer. At step 1106, an interposer is provided. The interposer may be the same or similar to the interposer 120, which is discussed above with respect to FIGS. 1-10B. The interposer may include a plurality of conductive traces that are formed on a substrate. Providing the interposer may include mounting the interposer over the layer of dielectric material that is part of the leadframe. The interposer may be mounted by using a die-attach layer, such as the layer 162 which is discussed above with respect to FIGS. 1-10B. At step 1108, the plurality of terminals of the current sensor die are coupled to the secondary leads of the lead frame via the interposer. The coupling may be performed in accordance with any of the methods discussed above with respect to FIGS. 1-10B.

Figure 12A:
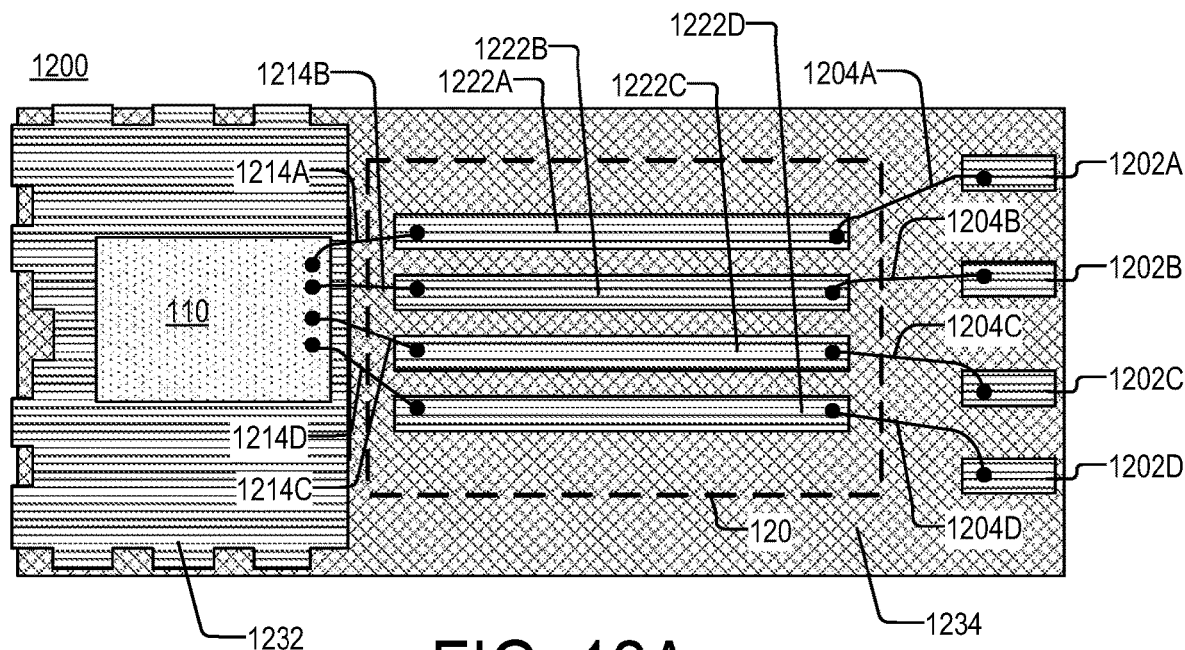
FIG. 12A is a top-down view of a sensor package, according to aspects of the disclosure.
Figure 12B:
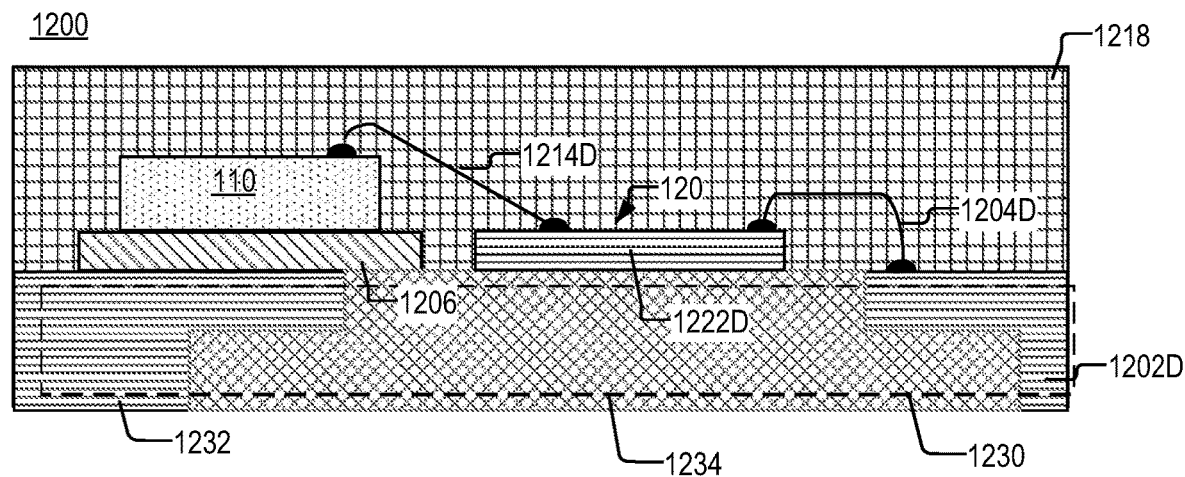
FIG. 12B is cross-sectional side view of the sensor package of FIG. 12A, according to aspects of the disclosure.
Figure 12C:
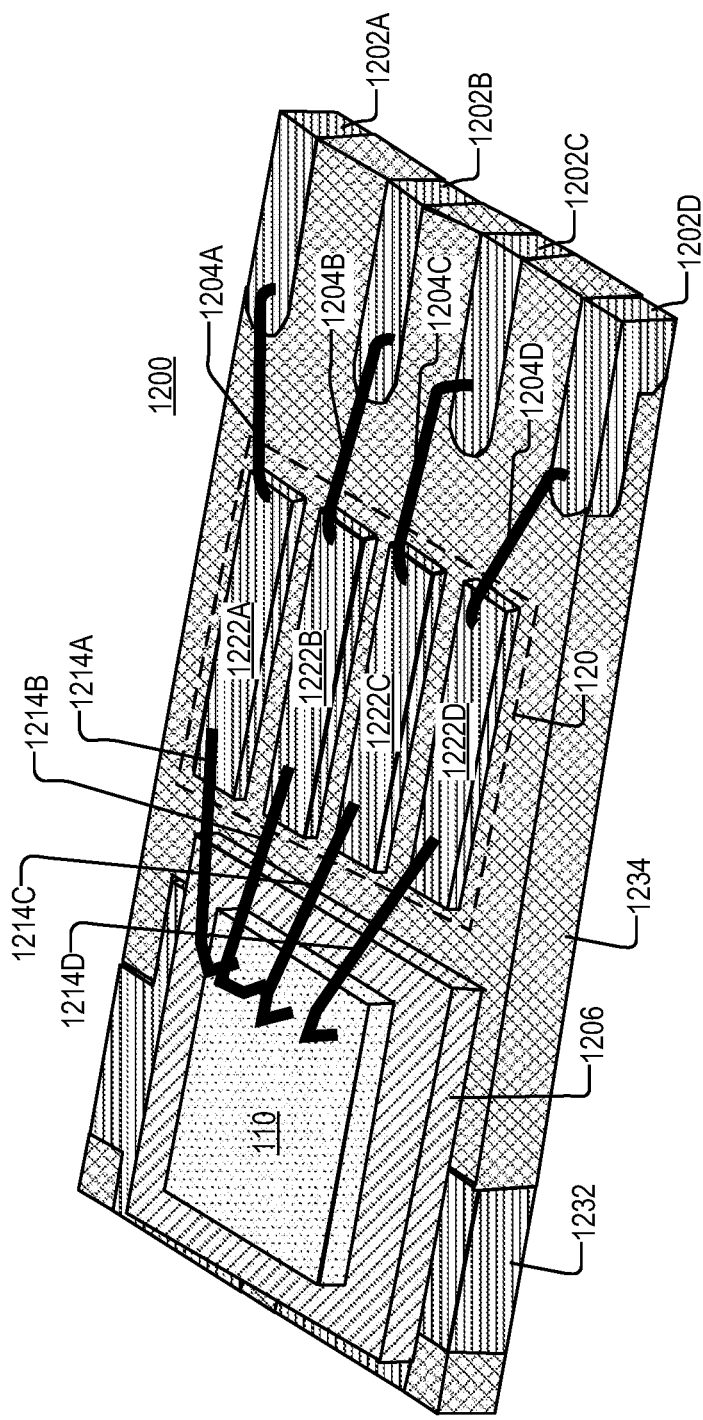
FIG. 12C is a perspective view of the sensor package of FIG. 12A, according to aspects of the disclosure.

FIGS. 12A-C show an example of a sensor package 1200, according to aspects of the disclosure. Similar to the sensor package 100 (shown in FIGS. 1-3), the sensor package 1200 may also include the sensor die 110 (shown in FIG. 6) and an interposer 120. In the example of FIGS. 12A-C, the interposer 120 is formed directly on the leadframe of the sensor package. This is in contrast to the preceding examples in which the interposer 120 includes a substrate 410 (shown in FIGS. 4-5 and 9C-E).

As illustrated, the sensor package 1200 may include a primary conductor 1232 and a plurality of secondary leads 1202A-D. A layer of dielectric material 1234 may be formed between the primary conductor 1232 and the secondary leads 1202A-D to form a leadframe 1230. The primary conductor 1232 may be the same or similar to the primary conductor 132, which is discussed above with respect to FIGS. 1-3. The primary conductor 1232 may be configured to carry an electrical current that is measured by the sensor die 110.

The sensor die 110 may be coupled to the leadframe 1230 via a mounting structure 1206. The mounting structure 1206 may include an isolation structure, such as the isolation structure 152 (shown in FIGS. 1-3), and a die-attach layer, such as the die-attach layer 154 (also shown in FIGS. 1-3). The isolation structure may be disposed between the sensor die 110 and the primary conductor 1232. The die-attach layer may be disposed between the isolation structure and the sensor die 110. The die-attach layer may be used to affix the sensor die to the isolation structure. The isolation structure may be configured to provide electrical isolation of the sensor die 110 from the primary conductor 1232.

The interposer 120 may include conductive members 120. In the example of FIGS. 12A-C, each of conductive members 1222A-D is electrically isolated from the remaining ones of the conductive members 1222A-D. Furthermore, in the example of FIG. 12A-C, conductive members 1222A-D are implemented as conductive traces that are formed directly on the layer of dielectric material 1234 by using standard lithographic (or printing) or deposition techniques. However, alternative implementations are possible in which each of the conductive members 1222A-D is implemented as a separate metal member that is mounted on the layer of dielectric material 1234 via a respective mounting structure. In this case, the respective mounting structure that is used to mount the mount each of the conductive members 1222A-D on the layer of dielectric material 1234 may be the same or similar to the mounting structure 808, which is discussed above with respect to FIGS. 8A-B. Furthermore, in some implementations, the conductive members 1222A-D may be implemented as metal members that are disposed inside the layer of dielectric material 1234. In the latter case, the conductive members 1222A-D may be fully or partially encapsulated by the layer of dielectric material 1234. Additionally or alternatively, as noted above, each of the conductive traces 1222A-D may be formed on a flexible PCB.

The interposer 120 may be arranged to couple the sensor die 110 to the secondary leads 1202A-D. The sensor die 110 may include terminals 172A-D, which are shown in FIG. 6. Conductive member 1222A may have a first end that is coupled to terminal 172A of the sensor die 110 via a wire bond 1214A and a second end that is coupled to the secondary lead 1202A via a wire bond 1204A. Conductive member 1222B may have a first end that is coupled to terminal 172B of the sensor die 110 via a wire bond 1214B and a second end that is coupled to the secondary lead 1202B via a wire bond 1204B. Conductive member 1222C may have a first end that is coupled to terminal 172C of the sensor die 110 via a wire bond 1214C and a second end that is coupled to the secondary lead 1202C via a wire bond 1204C. Conductive member 1222D may have a first end that is coupled to terminal 172D of the sensor die 110 via a wire bond 1214D and a second end that is coupled to the secondary lead 1202D via a wire bond 1204D. The conductive members 1222A-D and sensor die 110 may be encapsulated in an overmold 1218, as shown in FIG. 12B.

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used throughout the disclosure, the term product may include a physical object that is being bought and sold, a service, and/or anything else that can be purchased and solved. FIGS. 1-11 are provided as an example only. Although the sensor die 110 in the example of FIGS. 1-11 includes four terminals, it will be understood that it can include any number of terminals. In some implementations, the sensor die 110 may include the die of any current sensor that is known in the art. Although the sensor packages in the example of FIGS. 1-11 include four secondary leads, it will be understood that they can include any number of leads. Although the secondary leads and internal conductors are made of metal, it will be understood that they can be made of any conductive material.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

To the extent directional terms are used in the specification and claims (e.g., upper, lower, parallel, perpendicular, etc.), these terms are merely intended to assist in describing and claiming the invention and are not intended to limit the claims in any way. Such terms, do not require exactness (e.g., exact perpendicularity or exact parallelism, etc.), but instead it is intended that normal tolerances and ranges apply. Similarly, unless explicitly stated otherwise, each numerical value and range should be interpreted as being approximate as if the word "about", "substantially" or "approximately" preceded the value of the value or range.

Moreover, the terms "system," "component," "module," "interface,", "model" or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Although the subject matter described herein may be described in the context of illustrative implementations to process one or more computing application features/operations for a computing application having user-interactive components the subject matter is not limited to these particular embodiments. Rather, the techniques described herein can be applied to any suitable type of user-interactive component execution management methods, systems, platforms, and/or apparatus.

While the exemplary embodiments have been described with respect to processes of circuits, including possible implementation as a single integrated circuit, a multi-chip module, a single card, or a multi-card circuit pack, the described embodiments are not so limited. As would be apparent to one skilled in the art, various functions of circuit elements may also be implemented as processing blocks in a software program. Such software may be employed in, for example, a digital signal processor, micro-controller, or general-purpose computer.

Some embodiments might be implemented in the form of methods and apparatuses for practicing those methods. Described embodiments might also be implemented in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the claimed invention. Described embodiments might also be implemented in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the claimed invention. When implemented on a general-purpose processor, the program code segments combine with the processor to provide a unique device that operates analogously to specific logic circuits. Described embodiments might also be implemented in the form of a bitstream or other sequence of signal values electrically or optically transmitted through a medium, stored magnetic-field variations in a magnetic recording medium, etc., generated using a method and/or an apparatus of the claimed invention.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments.

Also, for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

It will be further understood that various changes in the details, materials, and arrangements of the parts which have been described and illustrated in order to explain the nature of the claimed invention might be made by those skilled in the art without departing from the scope of the following claims.

The invention claimed is:

1. A sensor package comprising:
a lead frame including: (i) a primary conductor, (ii) a plurality of secondary leads, and (iii) a layer of dielectric material that is disposed between the primary conductor and the plurality of secondary leads;
a current sensor die including one or more sensing elements, the current sensor die being configured to measure a level of electrical current through the primary conductor of the lead frame; and
an interposer that is dispose between the current sensor die and the secondary leads, the interposer being spaced apart laterally from the primary conductor and the current sensor die, the interposer being disposed over the layer of dielectric material, the interposer including a substrate and a plurality of conductive traces that are formed on the substrate, the plurality of conductive traces being configured to couple each of a plurality of terminals of the current sensor die to a respective one of the plurality of secondary leads,
wherein: (i) the primary conductor and the current sensor die are disposed in a first end portion of the sensor package, and the current sensor die is disposed over the primary conductor, (ii) the plurality of secondary leads is disposed in a second end portion of the sensor package, and (iii) the interposer is disposed in a middle portion of the sensor package, the middle portion being situated between the first end portion and the second end portion.

2. The sensor package of claim 1, wherein each of the plurality of conductive traces includes a respective first end a respective second end, the respective first end of any of the plurality of conductive traces being coupled to a different one of the plurality of terminals of the current sensor die via a respective first wire bond, and the respective second end of any of the plurality of conductive traces being coupled to a different one of the plurality of secondary leads via a respective second wire bond.

3. The sensor package of claim 1, further comprising a plurality of internal conductors that are disposed between the current sensor die and the interposer, wherein:
each of the plurality of terminals of the current sensor die is coupled to a different one of the plurality of internal conductors via a respective first conductive structure; and
each of the plurality of conductive traces of the interposer incudes a first end and a second end, such that the first end of each of the plurality of conductive traces is coupled to a different one of the plurality of internal conductors via a respective second conductive structure, and the second end of each of the plurality of conductive traces is coupled to a different one of the plurality of secondary leads via a respective third conductive structure.

4. The sensor package of claim 3, wherein any of the first, second, and third conductive structures includes one of a solder ball, a copper pillar, a gold bump, a eutectic or high lead solder bump, a no-lead solder bump, a gold stud bump, a polymeric conductive bump, a layer of anisotropic conductive paste, or a conductive film.

5. The sensor package of claim 1, further comprising a plurality of internal conductors that are disposed on the lead frame between the current sensor die and the interposer, wherein:
each of the plurality of terminals of the current sensor die is coupled to a different one of the plurality of internal conductors via a respective first conductive structure; and
each of a plurality of conductive traces incudes a first end and a second end, such that the first end of each of the plurality of conductive traces is coupled to a different one of the plurality of internal conductors via a respective second conductive structure, and the second end of each of the plurality of conductive traces is coupled to a different one of the plurality of secondary leads via a respective wire bond.

6. The sensor package of claim 1, wherein the interposer is part of a flexible printed circuit board (PCB), the flexible PCB having a substrate, such that a part of the substrate is disposed between the primary conductor of the leadframe and the current sensor die to provide the current sensor die with electrical isolation from the primary conductor.

7. The sensor package of claim 5, wherein:
the interposer includes a plurality of first contact pads that are formed on a first surface of the interposer and a plurality of second contact pads that are formed on a second surface of the interposer, the second surface being opposite to the first surface,
the first end of each of the plurality of conductive traces is coupled to a different one of the plurality of internal conductors via a respective one of the plurality of first contact pads, and
the second end of each of the plurality of conductive traces is coupled to a different one of the plurality of secondary leads via a respective one of the plurality of second contact pads.

8. The sensor package of claim 1, wherein each of the plurality of conductive traces of the interposer incudes a first end and a second end, such that the first end of each of the conductive traces is coupled to a different one of the plurality of terminals of the current sensor die via a respective wire bond, and the second end of each of the conductive traces is coupled to a different one of the plurality of secondary leads via a respective conductive structure.

9. The sensor package of claim 8, wherein any of the conductive structures includes one of a solder ball, a copper pillar, a gold bump, a eutectic or high lead solder bump, a no-lead solder bump, a gold stud bump, a polymeric conductive bump, a layer of anisotropic conductive paste, or a conductive film.

10. The sensor package of claim 8, wherein:
the interposer includes a plurality of first contact pads that are formed on a first surface of the interposer and a plurality of second contact pads that are formed on a second surface of the interposer, the second surface being opposite to the first surface,
the first end of each of the plurality of conductive traces is coupled to different one of the plurality of terminals of the current sensor via a respective one of the plurality of first contact pads, and the second end of each of the plurality of conductive traces is coupled to a different one of the plurality of secondary leads via a respective one of the plurality of second contact pads.

11. A sensor package comprising:
a lead frame including: (i) a primary conductor, (ii) a plurality of secondary leads, and (iii) a layer of dielectric material that is disposed between the primary conductor and the plurality of secondary leads;
an isolation structure that is disposed over the primary conductor;
a current sensor die including one or more sensing elements, the current sensor die being configured to measure a level of electrical current through the primary conductor of the lead frame;
an interposer that is disposed between the current sensor die and the secondary leads, the interposer being spaced apart laterally from the primary conductor and the current sensor die, the interposer being disposed over the layer of dielectric material, the interposer including substrate and a plurality of conductive traces that are formed on the substrate;
a plurality of first wire bonds, each of the first wire bonds being configured to couple the current sensor die to a different one of the plurality of conductive traces; and
a plurality of second wire bonds, each of the plurality of second wire bonds being configured to couple a different one of the plurality of conductive traces to a respective one of the plurality of secondary leads,
wherein the primary conductor and the plurality of secondary leads are spaced apart laterally from each other by at least 4 mm.

12. The sensor package of claim 11, wherein the interposer includes at least one of (i) electronic circuitry for processing one or more signals that are generated by the current sensor die and/or (ii) power circuitry.

13. The sensor package of claim 11, further comprising a layer of adhesive material that is disposed between the current sensor die and the isolation structure.

14. The sensor package of claim 11, wherein the isolation structure is provided in the form of a tape.

15. The sensor package of claim 11, wherein the isolation structure is provided in the form of a tape and the tape extends beyond a periphery of the current sensor die.

16. The sensor package of claim 11, wherein the isolation structure overlaps with the layer of dielectric material.

17. The sensor package of claim 11, further comprising an overmold configured to encapsulate the current sensor die and the interposer.

18. The sensor package of claim 11, further comprising a layer of adhesive material that is disposed between the interposer and the layer of dielectric material.

19. A method for manufacturing a sensor package, the method comprising:
providing a primary conductor and a plurality of secondary leads;
providing a layer of dielectric material between the primary conductor and the plurality of secondary leads;
providing an isolation structure over the primary conductor;
mounting a current sensor die on the isolation structure;
mounting an interposer on the layer of dielectric material, the interposer being disposed between the current sensor die and the secondary leads, the interposer being spaced apart laterally form the current sensor die and the secondary leads, the interposer including a substrate and a plurality of conductive traces that are formed on the substrate;
providing a plurality of first wire bonds, each of the first wire bonds being configured to couple the current sensor die to a different one of the plurality conductive traces; and
providing a plurality of second wire bonds, each of the second wire bonds being configured to couple a different one of the plurality of conductive traces to a respective one of the plurality of secondary leads.

20. The method of claim 19, wherein providing the primary conductor and the plurality of secondary leads includes etching and/or stamping a metal sheet to form the primary conductor and the plurality of secondary leads.

21. The method of claim 19, wherein providing the layer of dielectric material includes at least one of: (i) injection molding the dielectric material between the primary conductor and the secondary leads to form a unitary leadframe and/or (ii) heating and melting a dielectric powder to form a unitary leadframe.

22. The method of claim 19, wherein the isolation structure includes an isolation tape.

23. The method of claim 19, wherein the current sensor die is configured to measure a level of electrical current through the primary conductor.

24. The method of claim 19, wherein the interposer includes at least one of (i) electronic circuitry for processing one or more signals that are generated by the current sensor die, and/or (ii) power circuitry.

25. The method of claim 19, wherein the isolation structure overlaps with the layer of dielectric material.

26. A method for manufacturing a sensor package, the method comprising:
providing a lead frame including: (i) a primary conductor, (ii) a plurality of secondary leads, and (iii) a layer of dielectric material that is disposed between the primary conductor and the plurality of secondary leads;
providing a current sensor die including one or more sensing elements, the current sensor die being configured to measure a level of electrical current through the primary conductor of the lead frame, the current sensor die being disposed over the lead frame, the current sensor die being spaced apart laterally from the secondary leads; and
providing an interposer that is disposed over the layer of dielectric material between the current sensor die and the secondary leads, the interposer including a plurality of conductive traces that are configured to couple the current sensor die to the plurality of secondary leads,
wherein: (i) the primary conductor and the current sensor die are disposed in a first end portion of the sensor package, and the current sensor die is disposed over the primary conductor, (ii) the plurality of secondary leads is disposed in a second end portion of the sensor package, and (iii) the interposer is disposed in a middle portion of the sensor package, the middle portion being situated between the first end portion and the second end portion.

27. The method of claim 26, further comprising:
providing a plurality of internal conductors on the lead frame;
coupling each of a plurality of terminals of the current sensor die to a different respective one of the plurality of internal conductors via a respective first conductive structure;

coupling a respective first end of each of the plurality of conductive traces to a different respective one of the plurality of internal conductors via a respective second conductive structure, wherein each of the first conductive structures and the second conductive structures includes one of a solder ball, a copper pillar, a gold bump, a eutectic or high lead solder bump, a no-lead solder bump, a gold stud bump, a polymeric conductive bump, a layer of anisotropic conductive paste, or a conductive film.

28. The method of claim 26, further comprising coupling each of a plurality of terminals of the current sensor to a respective one of the plurality of conductive traces of the interposer via a respective wire bond.

29. The method of claim 26, further comprising coupling each of the plurality of conductive traces of the interposer to a different one of the plurality of secondary leads via a respective wire bond.

30. The method of claim 26, further comprising coupling each of the plurality of conductive traces of the interposer to a different one of the plurality of secondary leads via a respective conductive structure, the conductive structure including one of a solder ball, a copper pillar, a gold bump, a eutectic or high lead solder bump, a no-lead solder bump, a gold stud bump, a polymeric conductive bump, a layer of anisotropic conductive paste, or a conductive film.

31. The method of claim 26, wherein the interposer is part of a flexible printed circuit board (PCB), the flexible PCB having a substrate, such that a part of the substrate is disposed between the primary conductor of the leadframe and the current sensor die to provide the current sensor die with electrical isolation from the primary conductor.

32. A sensor package comprising:
a lead frame including: (i) a primary conductor, (ii) a plurality of secondary leads, and (iii) a layer of dielectric material that is disposed between the primary conductor and the plurality of secondary leads;
a current sensor die including one or more sensing elements, the current sensor die being configured to measure a level of electrical current through the primary conductor of the lead frame; and
an interposer that is disposed over the layer of dielectric material, the interposer being disposed between the current sensor die and the secondary leads, the interposer being spaced apart laterally from the current sensor die and the secondary leads, the interposer including a substrate and plurality of conductive members that are formed on the substrate, the plurality of conductive members being configured to couple each of a plurality of terminals of the current sensor die to a respective one of the plurality of secondary leads.

33. The sensor package of claim 32, wherein each of the conductive members includes one of a conductive trace that is formed on the layer of dielectric material or a metal member that is coupled to the layer of dielectric material via a mounting structure.

34. The sensor package of claim 32, wherein each of the plurality of conductive members includes a respective first end a respective second end, the respective first end of any of the plurality of conductive members being coupled to a different one of the plurality of terminals of the current sensor die via a respective first wire bond, and the respective second end of any of the plurality of conductive members being coupled to a different one of the plurality of secondary leads via a respective second wire bond.

* * * * *